(12) United States Patent
Tomabechi et al.

(10) Patent No.: US 9,196,685 B2
(45) Date of Patent: *Nov. 24, 2015

(54) SEMICONDUCTOR DEVICE AND MANUFACTURING METHOD THEREOF

(71) Applicant: FUJITSU LIMITED, Kawasaki-shi, Kanagawa (JP)

(72) Inventors: Shuichi Tomabechi, Atsugi (JP); Junji Kotani, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/324,650

(22) Filed: Jul. 7, 2014

(65) Prior Publication Data

US 2015/0090957 A1  Apr. 2, 2015

(30) Foreign Application Priority Data

Sep. 27, 2013 (JP) .................. 2013-202017

(51) Int. Cl.
*H01L 29/778* (2006.01)
*H01L 29/06* (2006.01)
(Continued)

(52) U.S. Cl.
CPC ........ *H01L 29/155* (2013.01); *H01L 29/66462* (2013.01); *H01L 29/7787* (2013.01); *H01L 29/2003* (2013.01)

(58) Field of Classification Search
CPC ............ H01L 29/7787; H01L 29/7786; H01L 29/2003; H01L 29/66431; H01L 29/66462; H01L 29/151; H01L 29/155
USPC ........ 257/14, 20, 22, 76, 190, 192, 194, 637, 257/E29.089, E29.246, E21.09, E33.025; 438/46, 172, 197, 285, 476, 478
See application file for complete search history.

(56) References Cited

U.S. PATENT DOCUMENTS 7,498,638 B2    3/2009 Suzuki
7,569,870 B2 *  8/2009 Yanagihara et al. .......... 257/192
(Continued)

FOREIGN PATENT DOCUMENTS

JP    2007-251144 A1    9/2007
JP    2008-21847 A1    1/2008
(Continued)

*Primary Examiner* — Dao H Nguyen
(74) *Attorney, Agent, or Firm* — Kratz, Quintos & Hanson, LLP

(57) ABSTRACT

A semiconductor device includes a first superlattice buffer layer formed on a substrate. A second superlattice buffer layer is formed on the first superlattice buffer layer. A first semiconductor layer is formed by a nitride semiconductor on the second superlattice buffer layer. A second semiconductor layer is formed by a nitride semiconductor on the first semiconductor layer. The first superlattice buffer layer is formed by alternately and cyclically laminating a first superlattice formation layer and a second superlattice formation layer. The second superlattice buffer layer is formed by alternately and cyclically laminating the first superlattice formation layer and the second superlattice formation layer. The first superlattice formation layer is formed by $Al_xGa_{1-x}N$, and the second superlattice formation layer is formed by $A_yGa_{1-y}N$, where x>y. A concentration of an impurity element doped into the second superlattice buffer layer is higher than that doped into the first superlattice buffer layer.

17 Claims, 21 Drawing Sheets

(51) Int. Cl.
*H01L 29/20* (2006.01)
*H01L 29/15* (2006.01)
*H01L 29/66* (2006.01)

(56) References Cited

U.S. PATENT DOCUMENTS

| | | | |
|---|---|---|---|
| 7,652,282 B2 | 1/2010 | Yanagihara | |
| 8,017,977 B2 | 9/2011 | Twynam | |
| 8,212,288 B2 | 7/2012 | Komiyama et al. | |
| 8,264,001 B2 | 9/2012 | Sato | |
| 8,847,203 B2 | 9/2014 | Ikuta et al. | |
| 8,957,454 B2* | 2/2015 | Briere | 257/194 |
| 2002/0100412 A1* | 8/2002 | Hirayama et al. | 117/89 |
| 2006/0191474 A1* | 8/2006 | Chen et al. | 117/104 |
| 2006/0192195 A1* | 8/2006 | Lee | 257/14 |
| 2007/0056506 A1* | 3/2007 | Bridger et al. | 117/89 |
| 2008/0203382 A1 | 8/2008 | Yanagihara | |
| 2008/0308843 A1 | 12/2008 | Twynam | |
| 2010/0237387 A1 | 9/2010 | Sato | |
| 2011/0062556 A1 | 3/2011 | Komiyama et al. | |
| 2011/0298009 A1 | 12/2011 | Ikuta | |
| 2012/0273759 A1 | 11/2012 | Ikuta | |
| 2013/0075786 A1* | 3/2013 | Ishiguro | 257/194 |
| 2014/0091314 A1 | 4/2014 | Ishiguro et al. | |
| 2015/0060765 A1* | 3/2015 | Kotani et al. | 257/22 |

FOREIGN PATENT DOCUMENTS

| | | |
|---|---|---|
| JP | 2008124373 A | 5/2008 |
| JP | 2008-171843 A1 | 7/2008 |
| JP | 2008205117 A | 9/2008 |
| JP | 2008218479 A | 9/2008 |
| JP | 2010-153817 A1 | 7/2010 |
| JP | 2010225703 A | 10/2010 |
| JP | 2011082494 A | 4/2011 |
| JP | 2012009630 A | 1/2012 |
| JP | 2012099539 A | 5/2012 |
| JP | 2012151422 A | 8/2012 |

* cited by examiner

SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2013-202017, filed on Sep. 27, 2013, the entire contents of which are incorporated herein by reference.

FIELD

The embodiments discussed herein are directed to a semiconductor device and a manufacturing method of a semiconductor device.

BACKGROUND

A nitride semiconductor has features such as a high saturation electron speed, a wide band gap, etc. Thus, it is considered to apply the nitride semiconductor to semiconductor devices having a high breakdown voltage and a high output power. For example, the bad gap of GaN, which is a nitride semiconductor, is 3.4 eV, which is higher than the band gap of Si (1.1 eV) and the band gap of GaAs (1.4 eV). Thus, GaN has a high, breakdown electric field strength. Accordingly, the nitride semiconductor such as GaN or the like is extremely hopeful as a material to fabricate a power supply semiconductor device providing a high-voltage operation and a high-output.

As a semiconductor device using a nitride semiconductor, there are many reports with respect to a filed effect transistor, particularly, a high electron mobility transistor (HEMT). For example, from among GaN-HEMTs, an HEMT made of AlGaN/GaN attracts attention wherein GaN issued as an electron transit layer and AlGaN is used as an electron supply layer. In the HEMT made of AlGaN/GaN, a strain is generated in AlGaN due to a difference in lattice constant between GaN and AlGaN. Thereby, a highly concentrated two-dimensional electron gas (2 DEG) can be obtained due to a piezoelectric polarization caused by such a strain and an intrinsic polarization difference. Thus, the AlGaN/GaN-HEMT is hopeful as a high-efficiency switch device and a high breakdown voltage power device for electric vehicle. Additionally, from the view point of circuit design and safety, it is desired to materialize a nitride semiconductor transistor having a normally off characteristic.

The following patent documents discloses a background art.

Patent Document 1: Japanese Laid-Open Patent Application No. 2008-21847

Patent Document 2: Japanese Laid-Open Patent Application No. 2010-153817

In the meantime, a GaN substrate is suitable for a substrate used in a manufacturing process of a semiconductor device using a nitride semiconductor. However, the GaN substrate is extremely difficult to manufacture, and there is no large substrate exists. Thus, it is considered to fabricate a semiconductor device using a substrate formed by Si, SiC, sapphire, etc., and causing an epitaxial growth of a nitride semiconductor or the substrate. Especially, it is preferable to manufacture a semiconductor device using a nitride semiconductor at a low cost by using especially an Si substrate because a large diameter and high-quality substrate is available.

In an HEMT composed of AlGaN/GaN formed on an Si substrate, in order to improve a breakdown voltage, if is required to make a film thickness of a buffer layer formed on the Si substrate and a film thickness of an electron transit layer formed on the buffer layer to be large. However, an epitaxial growth of a nitride semiconductor such as GaN or the like is made at a generally high substrate temperature. Accordingly, if the thickness of the buffer layer and the electron transit layer, a warp may be generated in the Si layer or a crack may be generated in the film-formed nitride semiconductor due to a difference in lattice constant and thermal expansion coefficient between GaN and Si.

Thus, a method of reducing a crystal strain to reduce a warp of an Si substrate is taken by forming a superlattice buffer layer of a superlattice structure on an Si substrate and forming an electron transit layer by GaN on the super lattice layer. By forming such a superlattice buffer layer, a warp of the Si substrate is improved, but there may be a case where a sufficient breakdown voltage is not obtained. If a warp of the Si substrate is large, there may be a case where a desired pattern is not obtained by exposure performed by an exposure apparatus or a case where it is difficult to convey a substrate. In Such a case, it is not preferable because a desired semiconductor device cannot be manufactured.

Accordingly, it is requested to materialize a semiconductor device, in which, a superlattice buffer layer is formed by a nitride semiconductor, having a small warp of a substrate, a high-resistance of the superlattice buffer layer and a high breakdown voltage.

SUMMARY

There is provided according to an aspect of the embodiments a semiconductor device including: a first superlattice buffer layer formed on a substrate; a second superlattice buffer layer formed on the first superlattice buffer layer; a first semiconductor layer formed by a nitride semiconductor on the second superlattice buffer layer; a second semiconductor layer formed by a nitride semiconductor on the first semiconductor layer; and a gate electrode, a source electrode and a drain electrode formed on the second semiconductor layer, wherein the first superlattice buffer layer is formed by alternately and cyclically laminating a first superlattice formation layer and a second superlattice formation layer, and the second superlattice buffer layer is formed by alternately and cyclically laminating the first superlattice formation layer and the second superlattice formation layer, and the first superlattice formation layer is formed by $Al_xGa_{1-x}N$, and the second superlattice formation layer is formed by $A_yGa_{1-y}N$, where x>y, and a concentration of an impurity element serving as an acceptor doped into the second superlattice buffer layer is higher than a concentration of an impurity element serving as an acceptor doped into the first superlattice buffer layer.

There is provided according to another aspect of the embodiments a semiconductor device including: a superlattice buffer layer formed on a substrate; a first semiconductor layer formed by a nitride semiconductor on the superlattice buffer layer; a second semiconductor layer formed by a nitride semiconductor on the first semiconductor layer; and a gate electrode, a source electrode and a drain electrode formed on the second semiconductor layer, wherein the superlattice buffer layer is formed by alternately and cyclically laminating a first superlattice formation layer and a second superlattice formation layer, and the first superlattice formation layer is formed by $Al_xGa_{1-x}N$, and the second superlattice formation layer is formed by $A_yGa_{1-y}N$, where x>y, and a concentration of an impurity element serving as an acceptor in the superlattice buffer layer increases from a side of the substrate toward a side of the first semiconductor layer.

There is provided according to a further aspect of the embodiments a manufacturing method of a semiconductor device, including: forming a first superlattice buffer layer by alternately and cyclically laminating a first superlattice formation layer and a second superlattice formation layer on a substrate; forming a second superlattice buffer layer by alternately and cyclically laminating the first superlattice formation layer and the second superlattice formation layer on the first superlattice buffer layer; forming a first semiconductor layer by a nitride semiconductor on the second superlattice buffer layer; forming a second semiconductor layer by a nitride semiconductor on the first semiconductor layer; and forming a gate electrode, a source electrode and a drain electrode on the second semiconductor layer, wherein the first superlattice formation layer is formed by $Al_xGa_{1-x}N$ and the second superlattice formation is formed by $Al_yGa_{1-y}M$, where x>y, and the first superlattice buffer layer and the second superlattice buffer layer are formed by a metal organic chemical vapor deposition, and a substrate temperature when forming the second superlattice buffer layer is lower than a substrate temperature when forming the first superlattice buffer layer.

The object and advantages of the embodiments will be realized and attained by means of the elements and combinations particularly pointed out in the appended claims.

It is to be understood that both the foregoing general description and the following detailed description are exemplary explanatory only and are not restrictive of the invention, as claimed.

DESCRIPTION OF EMBODIMENT(S)

Figure 1:
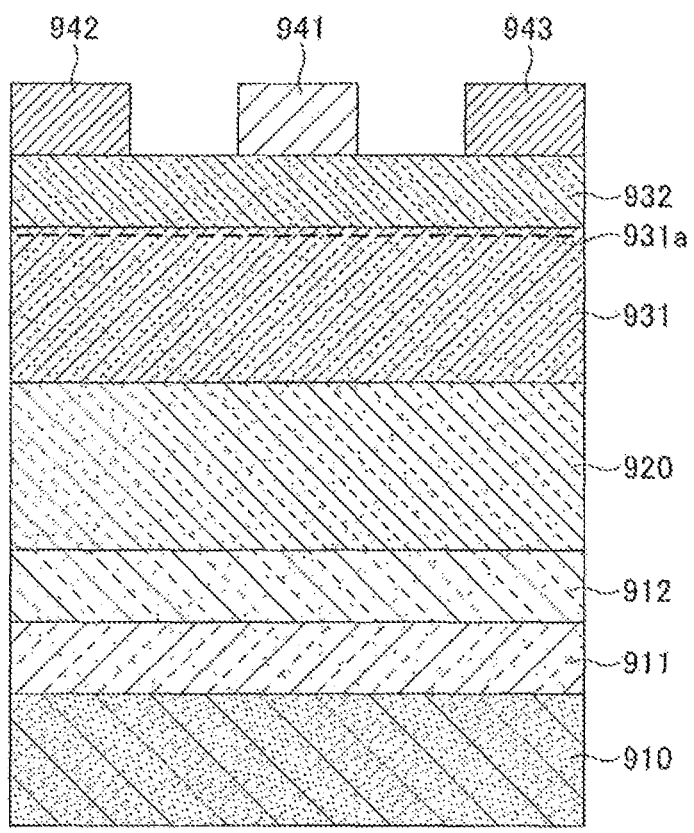
FIG. 1 is a cross-sectional view of a semiconductor device in which a superlattice buffer layer is formed.

A description will now be given of embodiments with reference to the drawings. In the drawings, the same parts are given the same reference number, and descriptions thereof will be omitted.

First Embodiment

First, a description will be given of a leak current flowing in a vertical direction, which is substantially perpendicular to a silicon substrate and a warp of the silicon substrate in a semiconductor device illustrated in FIG. 1.

The semiconductor device illustrated in FIG. 1 has a structure in which a nitride semiconductor layer is laminated on the silicon substrate 910. Specifically, a nuclear formation layer 911, a buffer layer 912, a superlattice buffer layer 920, an electron transit layer 931 and an electron supply layer 932 are laminated on the silicon substrate 910 in that order. A gate electrode 941, a source electrode 942 and an electron supply layer 943 are formed on the electron supply layer 932.

The nuclear formation layer 911 is formed by AlN or the like having a film thickness of 200 nm. The buffer layer 912 is formed by $Al_{0.1}Ga_{0.9}N$ having a film thickness of 50 nm. The superlattice buffer layer 920 is formed by alternately and cyclically laminating an AlN film and an $Al_{0.1}Ga_{0.9}N$ layer for 100 cycles. Generally, the superlattice buffer layer may be referred to as a strained-layer superlattice (SLS) layer.

The electron transit layer 931 is formed by i-GaN. The electron supply layer 932 is formed by AlGaN. Thereby, in the electron transit layer 931, 2 DEG 931a is created near the interface between the electron transit layer 931 and the electron supply layer 932.

A description is given below of a relationship between a voltage applied across a source and a drain and a leak current flowing in a vertical direction, and a warp generated in the semiconductor device having the electron supply layer 932 wherein a film thickness of an AlN layer forming the superlattice buffer layer 920 is varied. It should be noted that the leak current flowing in a vertical direction is a current flowing a direction substantially perpendicular to the silicon substrate 910 in the nitride semiconductor layer.

Figure 2:
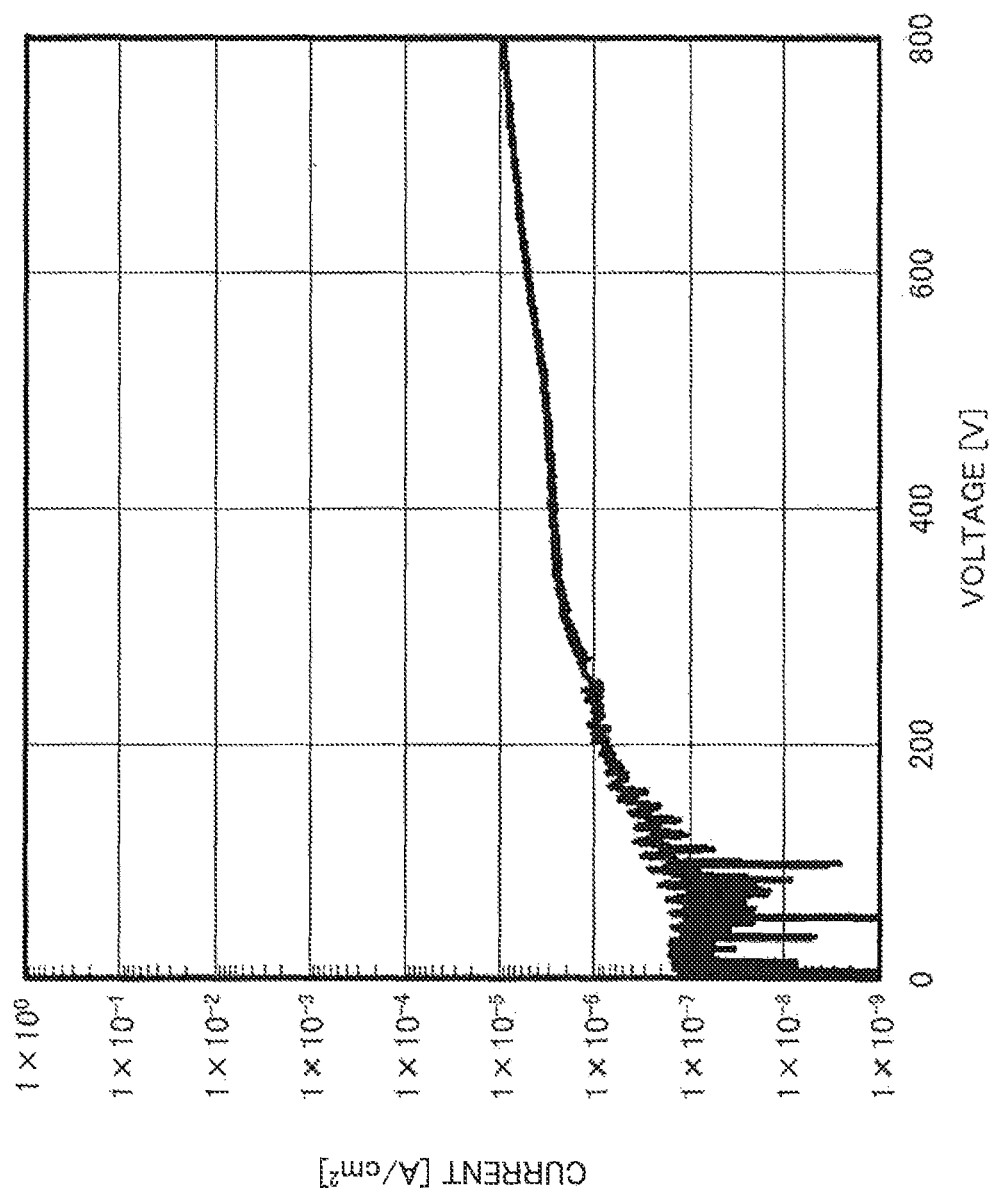
FIG. 2 is a graph of a leak current flowing in a semiconductor device in which a superlattice buffer layer has an AlN layer having a film thickness of 1.5 nm.
Figure 3:
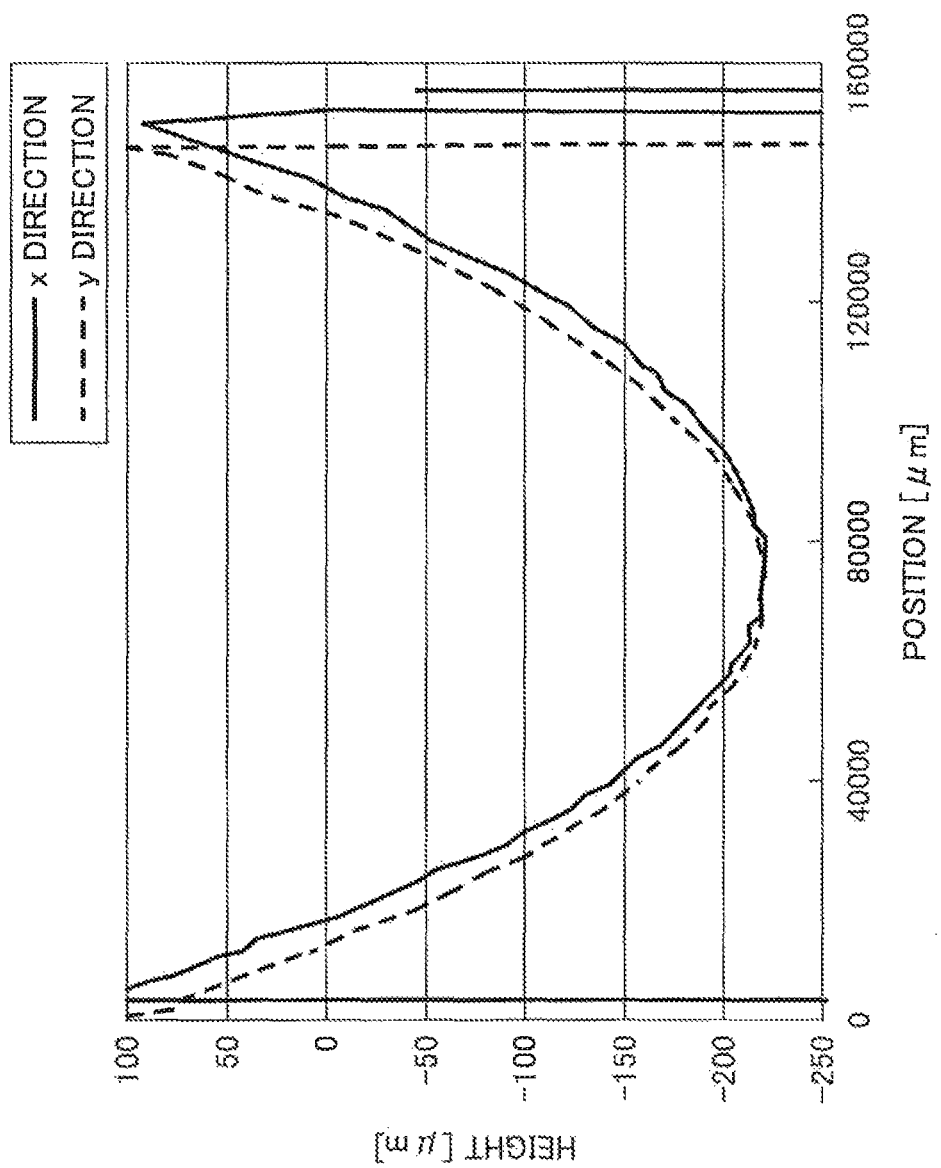
FIG. 3 is a graph indicating a warp of a silicon substrate on which a superlattice buffer layer having an AlN layer of a film thickness of 1.5 nm is formed.

FIG. 2 indicates a relationship between a voltage applied across a source and a drain and a leak current flowing in a vertical direction in the semiconductor device in which the superlattice buffer layer 920 is formed by alternately laminating an AlN film having a film thickness of 1.5 nm and an $Al_{0.1}Ga_{0.9}N$ layer having a film thickness of 20 nm. FIG. 3 indicates a relative height of a surface of the semiconductor device wherein the layers are formed up to the electron supply layer 932, that is, the gate electrode 941, the source electrode 942 and the drain electrode 943 have not been formed yet. A difference in height in the surface corresponds to a warp.

Figure 4:
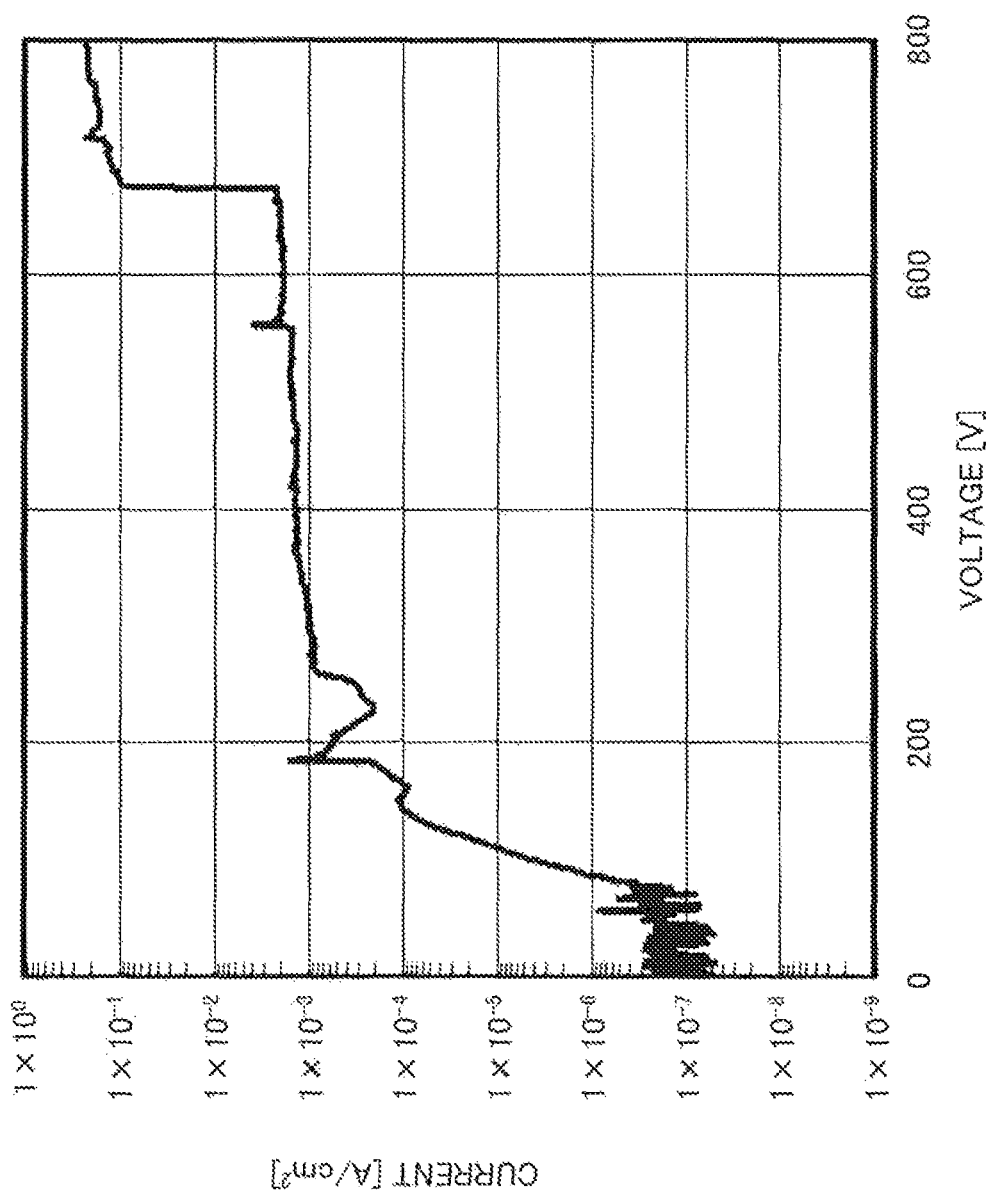
FIG. 4 is a graph of a leak current flowing in a semiconductor device in which a superlattice buffer layer has an AlN layer having a film thickness of 3.5 nm.

FIG. 4 indicates a relationship between a voltage applied across the source and the drain and a leak current flowing in a vertical direction in the semiconductor device in which the superlattice buffer layer 920 is formed by alternately laminating an AlN film having a film thickness of 3.5 nm and an $Al_{0.1}Ga_{0.9}N$ layer having a film thickness of 20 nm.

As illustrated in FIG. 2 and FIG. 4, the leak current is smaller in the case where the superlattice buffer layer 920 is formed by the AlN film having the film thickness of 1.5 nm than in the case where the superlattice buffer layer 920 is formed by the AlN film having the film thickness of 3.5 nm. Thus, from the view point of a leak current, the case where the superlattice buffer layer 920 is formed by the AlN film having the film thickness of 1.5 nm is more preferable than the case where the superlattice buffer layer 920 is formed by the AlN film having the film thickness of 3.5 nm.

Figure 6A:
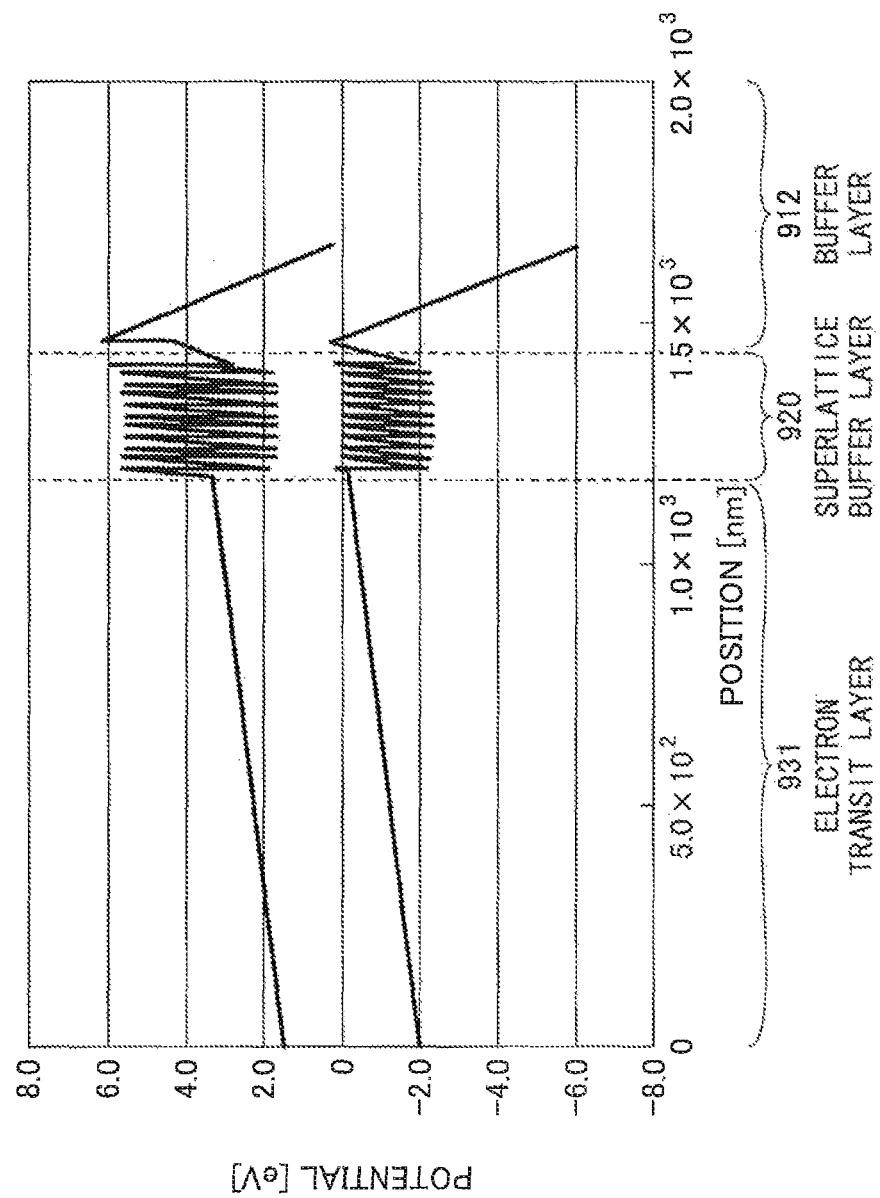
FIG. 6A is an energy band diagram of a semiconductor device containing a superlattice buffer layer having an AlN film having a film thickness of 1.5 nm.
Figure 6B:
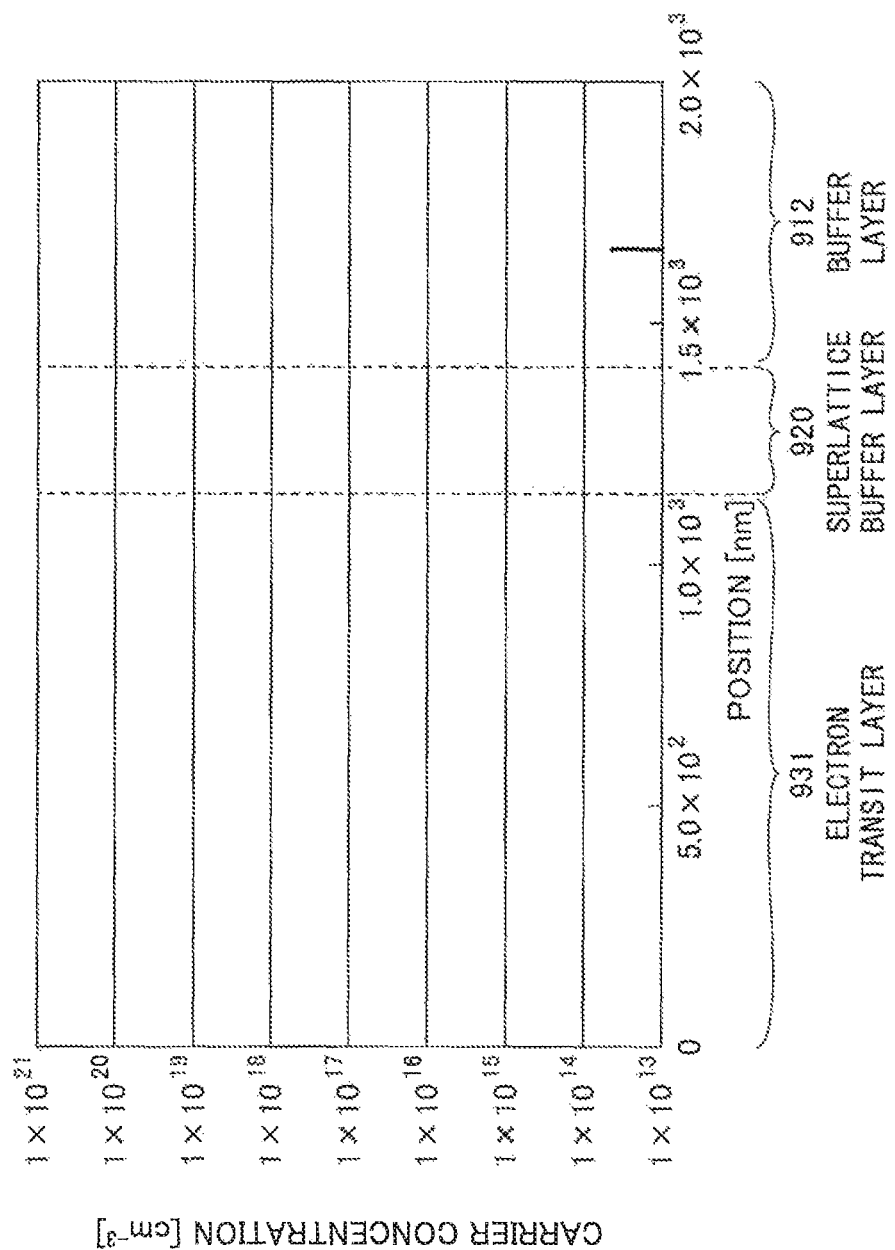
FIG. 6B is a graph indicating a carrier concentration distribution in the semiconductor device containing the superlattice buffer layer having the AlN film having a film thickness of 1.5 nm.
Figure 7A:
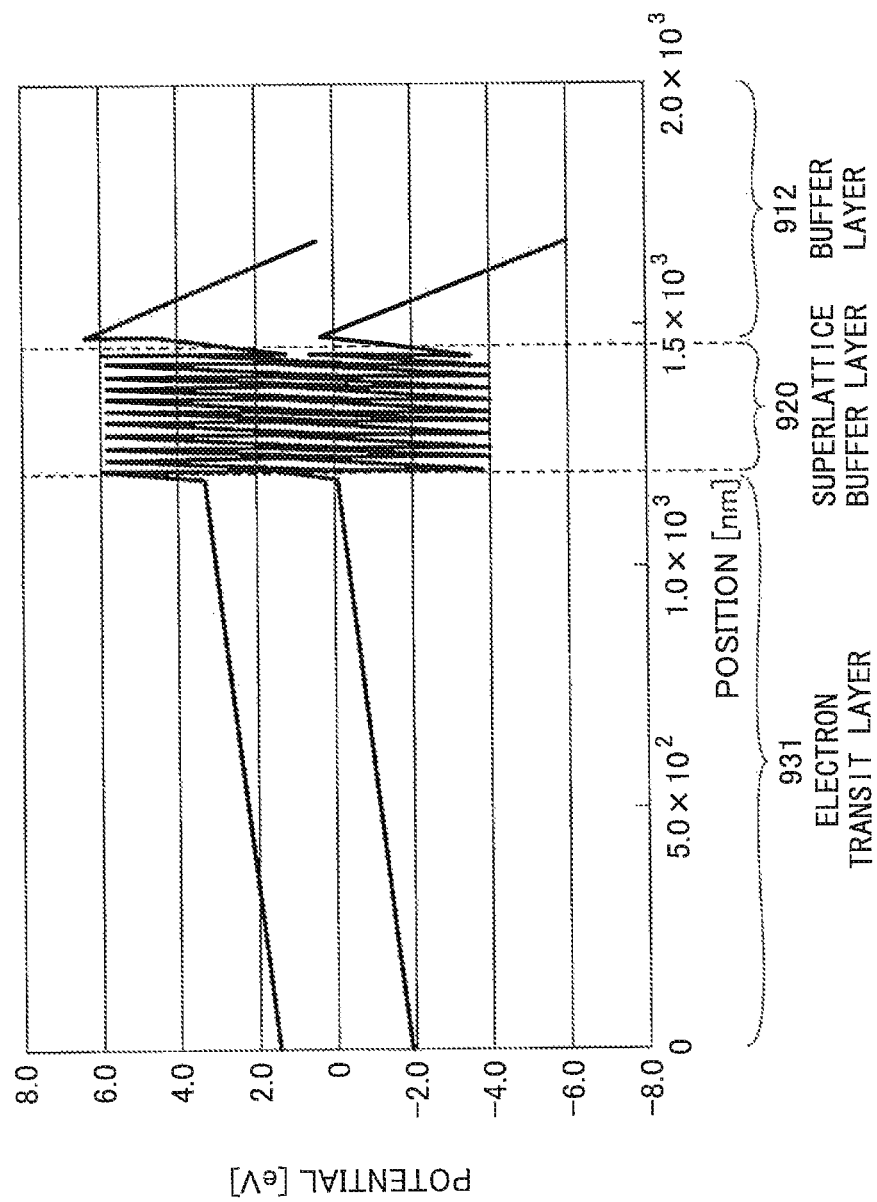
FIG. 7A is an energy band diagram of a semiconductor device containing a superlattice buffer layer having an AlN film having a film thickness of 3.5 nm.
Figure 7B:
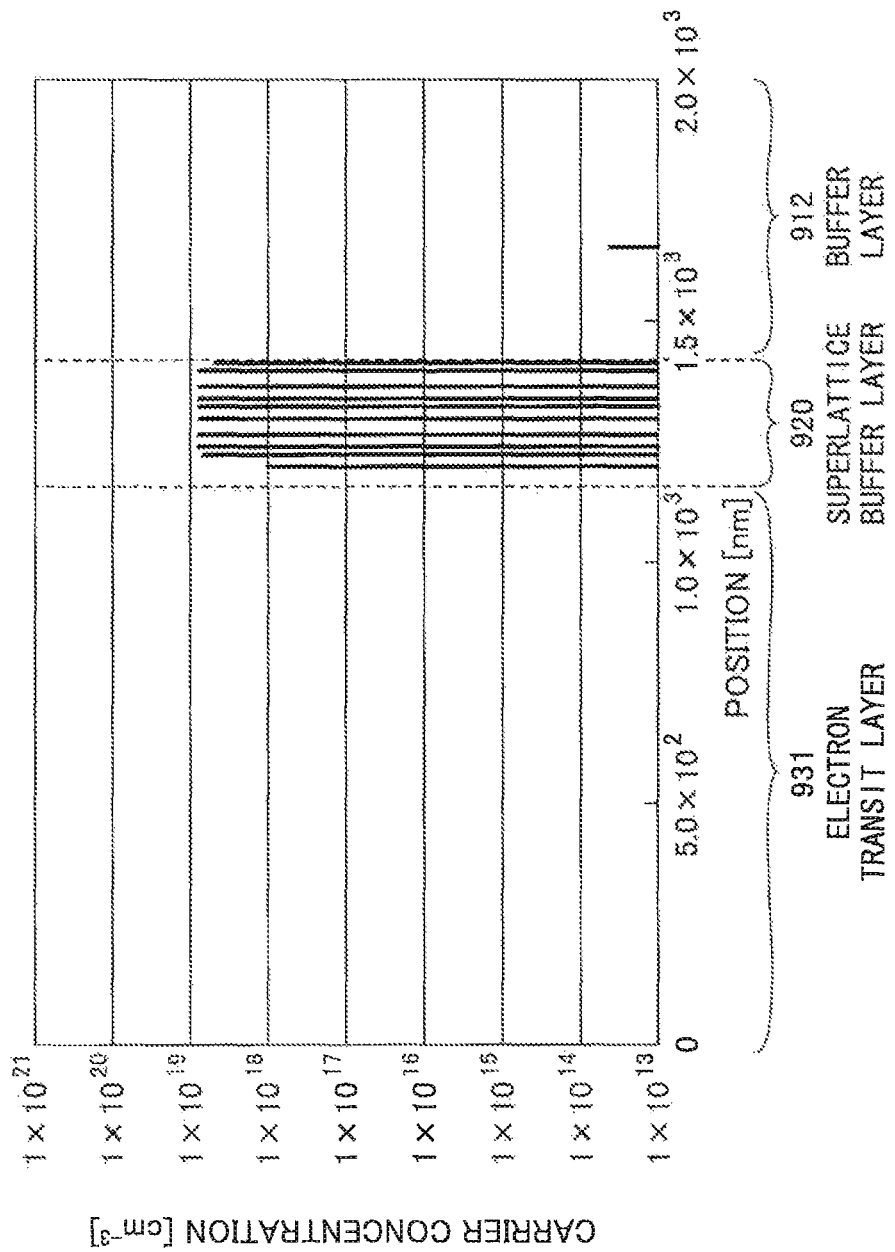
FIG. 7B is a graph indicating a carrier concentration distribution in the semiconductor device containing the superlattice buffer layer having the AlN film having a film thickness of 3.5 nm.

A description will be given of the fact that a leak current is smaller in the case where the superlattice buffer layer 920 is formed by the AlN film having a film thickness of 1.5 nm than a leak current in the case where the superlattice buffer layer 920 is formed by the AlN film having a film thickness of 3.5 nm. FIG. 6A is an energy band diagram in the case where the film thickness of the AlN film in the superlattice buffer layer 920 is 1.5 nm. FIG. 6B is a graph indicating an electron concentration distribution in the case where the film thickness of the AlN film in the superlattice buffer layer 920 is 1.5 nm. FIG. 7A is an energy band diagram in the case where the film thickness of the AlN film in the superlattice buffer layer 920 is 3.5 nm. FIG. 7B is a graph indicating an electron concentration distribution in the case where the film thickness of the AlN film in the superlattice buffer layer 920 is 3.5 nm. The energy band diagrams of FIGS. 6A and 7A and the electron concentration distributions of FIGS. 6B and 7B are results of simulation. It should be noted that in FIGS. 6A, 6B, 7A and 7B, a portion of the AlN film and the $Al_{0.1}Ga_{0.9}N$ layer together form the superlattice buffer layer 920 is omitted for the sake of convenience.

An electron concentration (carrier concentration) is lower in the case where the AlN film has a film thickness of 1.5 nm in the superlattice buffer layer 920 as illustrated in FIG. 6A is lower than an electron concentration in the case where the thickness of the AlN film in the superlattice buffer layer 920 3.5 nm as illustrated in FIG. 7B. Thus, if an electron concentration in the superlattice buffer layer 920 decreases, a resistance in the superlattice buffer layer 920 is increased, thereby resulting in a reduction in the leak current flowing in a vertical direction.

Figure 5:
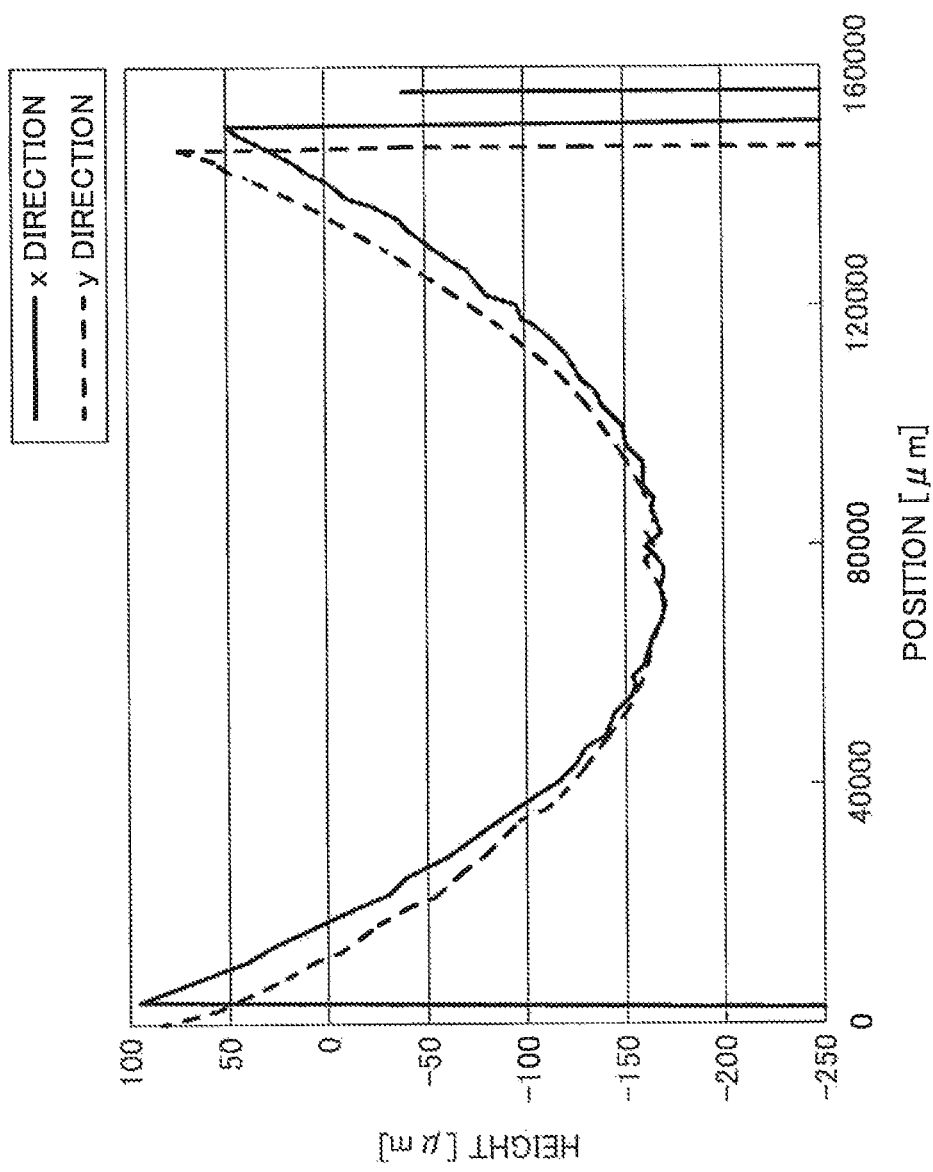
FIG. 5 is a graph indicating a warp of a silicon substrate on which a superlattice buffer layer having an AlN layer of a film thickness of 3.5 nm is formed.

A description is given below of a warp of the silicon substrate 910. As illustrated in FIG. 3 and FIG. 5, a height difference is about 320 μm in the case where the superlattice buffer layer 920 is formed by the AlN film having the film thickness of 3.5 nm. A height difference is about 250 μm in the case where the superlattice buffer layer 920 is formed by the AlN film having the film thickness of 1.5 nm. Thus, a warp of the silicon substrate 910 is smaller in the case where superlattice buffer layer 920 is formed by the AlN film having the film thickness of 3.5 nm than a warp of the silicon substrate 910 in the case where the superlattice buffer layer 920 is formed by the AlN film having the film thickness of 1.5 nm. Accordingly, from a point of view of a warp of the silicon substrate 910, the cause where the superlattice buffer layer 920 is formed by the AlN film having the film thickness of 3.5 nm is more preferable than the case where the superlattice buffer layer 920 is formed by the AlN film having the film thickness of 1.5 nm.

As mentioned above, if the film thickness of the AlN film in the superlattice buffer layer 920 is varied, the leak current and the warp of the silicon substrate 910 are in a trade-off relationship. Generally, it is requested to form the superlattice buffer layer 920 so that a leak current is small and a warp of the silicon substrate 910 is small. That is, a semiconductor device formed by a nitride semiconductor is requested to have a small leak current and a small warp of the silicon substrate 910.

As a method of reducing a leak current in a vertical direction, a method of doping C (carbon) as an impurity element into the superlattice buffer layer 920 is known. However, if a predetermined amount of C is doped into the entire superlattice buffer layer 920, it is not preferable because there may be a case where a crack or the like is generated in the nitride semiconductor layer.

(Semiconductor Device)

Figure 8:
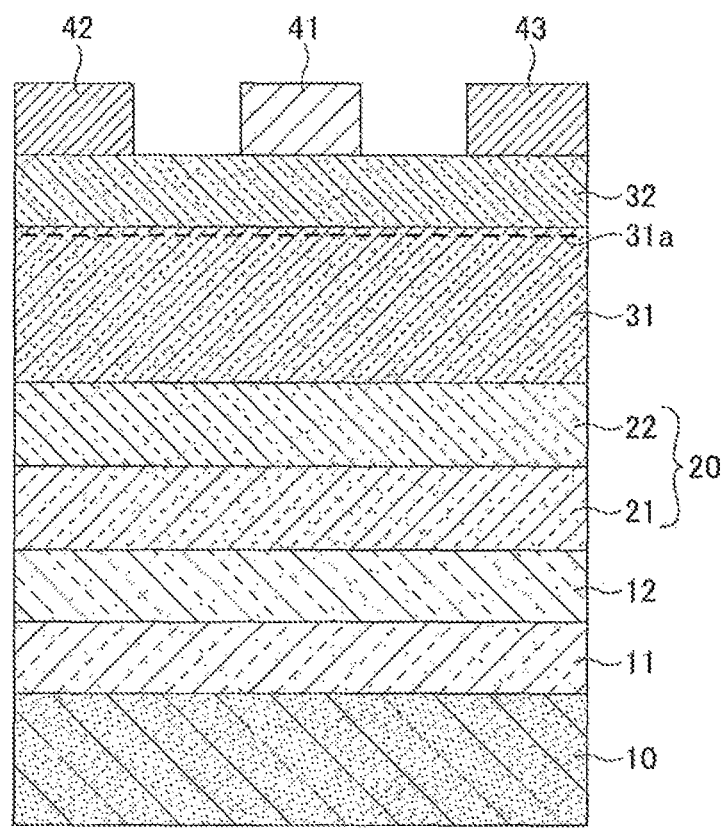
FIG. 8 is a cross-sectional view of a semiconductor device according to a first embodiment.
Figure 9:
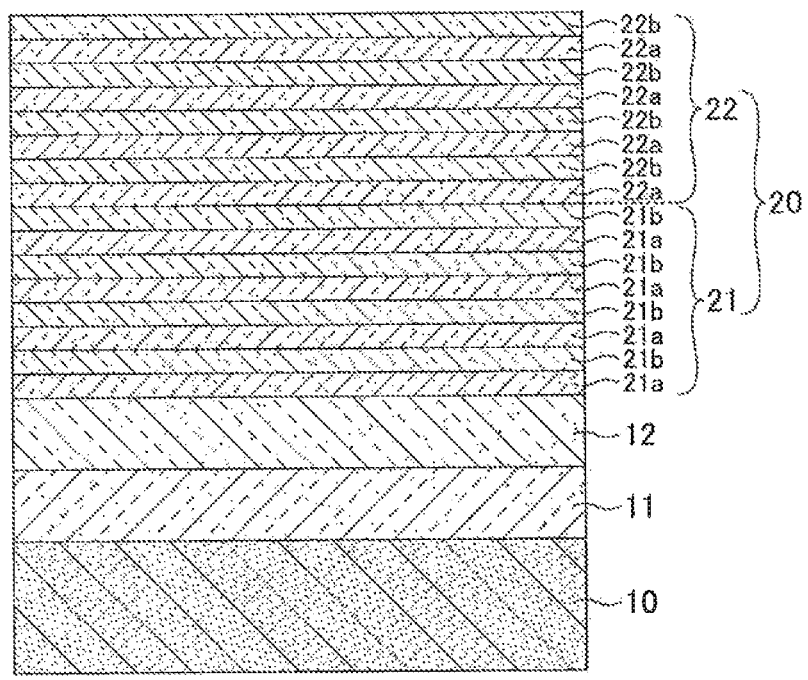
FIG. 9 is a cross-sectional view of a superlattice buffer layer in the semiconductor device according to the first embodiment.

A description will be given below of a semiconductor device according to a first embodiment. As illustrated in FIG. 8 and FIG. 9, the semiconductor device according to the present embodiment has a structure in which nitride semiconductor layers are laminated on a silicon substrate 10. Specifically, a nuclear formation layer 11, a buffer layer 12, a first superlattice buffer layer 21, a second superlattice buffer layer 22, an election transit layer 31 and an electron supply layer 32 are laminated on the silicon substrate 10 in that order. A gate electrode 41, a source electrode 42 and a drain electrode 43 are formed on the electron supply layer 32. In the present embodiment, the first superlattice buffer layer 21 and the second superlattice buffer layer 22 together may be referred to as a superlattice buffer layer 20. FIG. 9 is an enlarged cross-sectional view of a portion of the semiconductor device including the nuclear formation layer 11, the buffer layer 12 and the super lattice buffer layer 20 are formed on the silicon substrate 10.

In the present embodiment, a substrate formed by SiC, sapphire, GaN, etc., may be used instead of the silicon substrate 10. It should be noted that the nuclear formation layer 11 is formed by AlN or the like having a film thickness of 200 nm, and the buffer layer 12 is formed by $Al_{0.1}Ga_{0.9}N$ having a film thickness of 50 nm.

The first superlattice buffer layer 21 is formed by alternately laminating an AlN layer 21a having a film thickness of 3.5 nm and an $Al_{0.1}Ga_{0.9}N$ layer 21b having a film thickness of 20 nm for 50 cycles. The first superlattice buffer layer 21 is doped with C as an impurity element at a concentration lower than $1\times10^{19}$ atoms/cm$^{-3}$.

The first superlattice buffer layer 22 is formed by alternately and cyclically laminating an AlN layer 22a having a film thickness of 3.5 nm and an $Al_{0.1}Ga_{0.9}N$ layer 22b having a film thickness of 20 nm for 50 cycles. The first superlattice buffer layer 22 is doped with C as an impurity element at a concentration higher than or equal to $1\times10^{19}$ atoms/cm$^{-3}$ and lower than or equal to $1\times10^{20}$ atoms/cm$^{-3}$.

In the present embodiment, the first superlattice buffer layer 21 is doped with C at a concentration of $2\times10^{18}$ atoms/cm$^{-3}$, and the second superlattice buffer layer 22 is doped with C at a concentration of $2\times10^{19}$ atoms/cm$^{-3}$.

Additionally, in the present embodiment, the AlN layer 21a forming the first superlattice buffer layer 21 may be referred to as a first superlattice formation layer, and the $Al_{0.1}Ga_{0.9}N$ layer 21b may be referred to as a second superlattice formation layer. Moreover, the AlN layer 22a forming the second superlattice buffer layer 22 may be referred to as a first superlattice formation layer, and the $Al_{0.1}Ga_{0.9}N$ layer 22b may be referred to as a second superlattice formation layer.

The electron transit layer 31 reformed by i-GaN having a film thickness of 1000 nm. The electron supply layer 32 is formed by AlGaN having a film thickness of 20 nm. Thereby, in the electron transit layer 31, a 2 DEG 31a is created near the interface between the electron transit layer 31 and the electron supply layer 32. It should be noted that a cap layer (not illustrated in the figure) may be formed by n-GaN having a firm thickness of 5 nm on the electron supply layer 32.

Figure 10A:
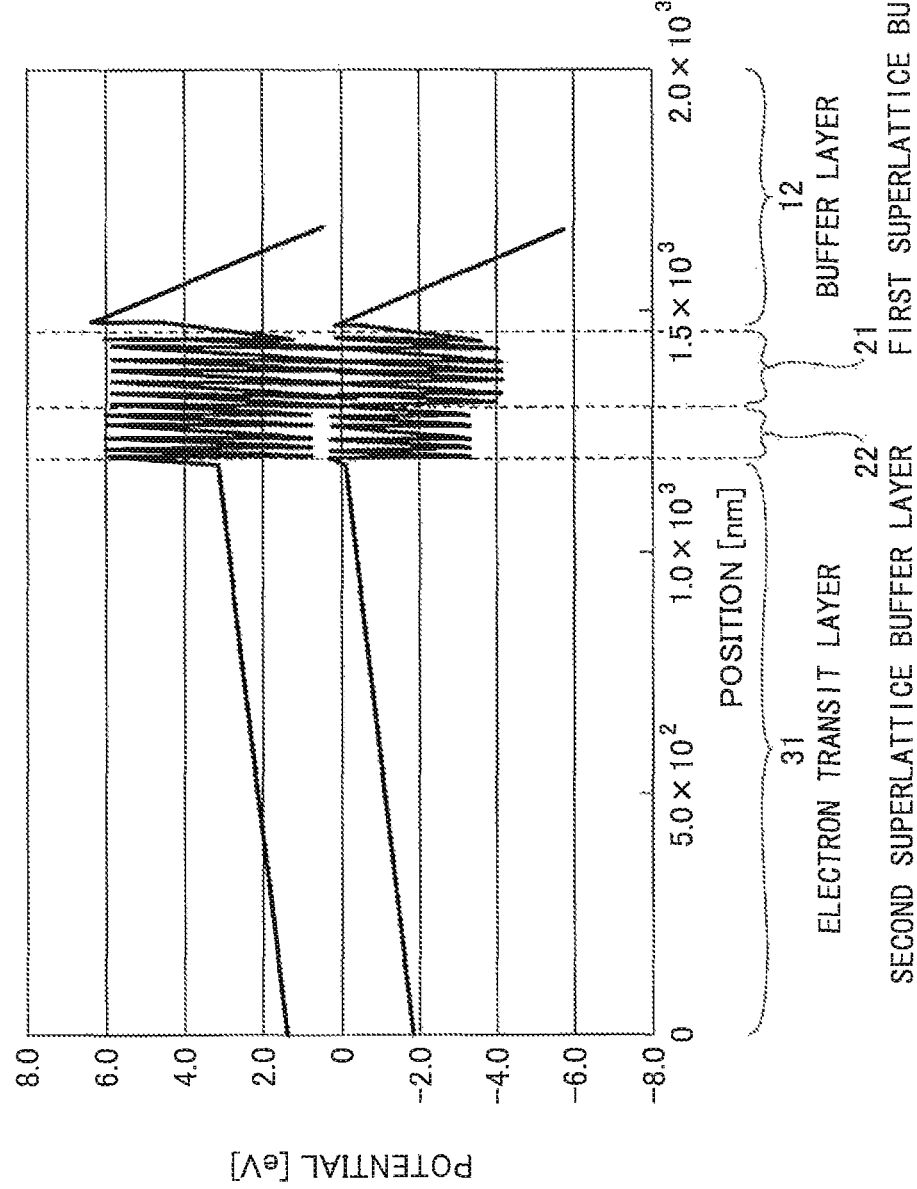
FIG. 10A is an energy band diagram of the semiconductor device containing the superlattice buffer layer having an AlN film having a film thickness of 1.5 nm.
Figure 10B:
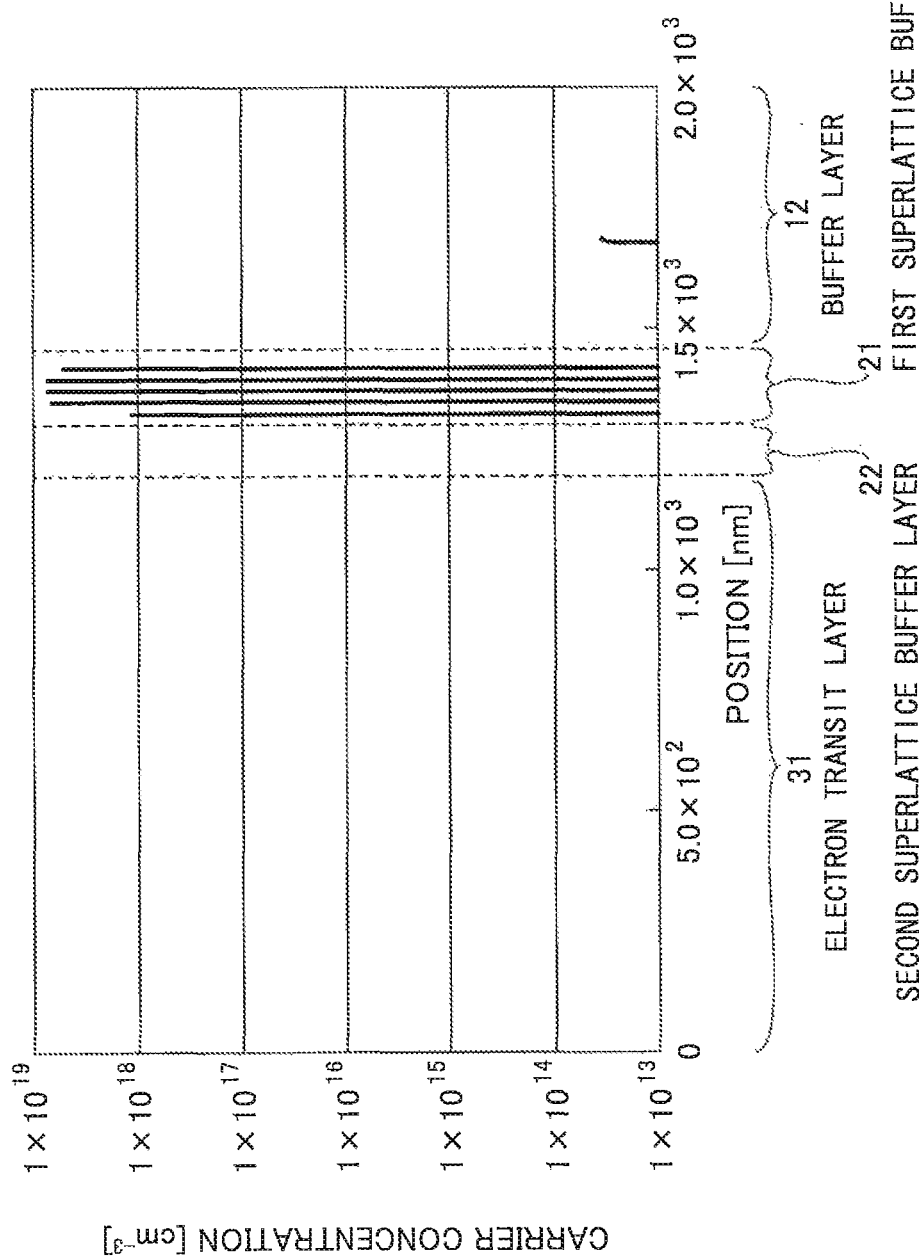
FIG. 10B is a graph indicating a carrier concentration distribution in the semiconductor device containing the superlattice buffer layer having the AlN film having a film thickness of 1.5 nm.

FIG. 10A is an energy band diagram in a case where the film thickness of the AlN film in the superlattice buffer layer 20 is 1.5 nm. FIG. 10B is a graph indicating an electron (carrier) concentration distribution in the case where the film thickness of the AlN film in the superlattice butter layer 20 is 1.5 nm. In FIGS. 10A and 10B, a portion of the first superlattice formation layer forming the first superlattice buffer layer 21 and a portion of the second superlattice formation layer forming the second superlattice buffer layer 22 are omitted for the sake of convenience.

As compared with the case of FIGS. 7A and 7B, an electron concentration (carrier concentration) in the second superlattice buffer layer 22 doped with C at a concentration of $2 \times 10^{19}$ atoms/cm$^{-3}$ is lower than or equal to $1 \times 10^{13}$ atoms/cm$^{-3}$ in the case of FIGS. 10A and 10B. Thus, a resistance in the second superlattice buffer layer 22 can be increased, and a leak current flowing in a vertical direction can be reduced.

Figure 11:
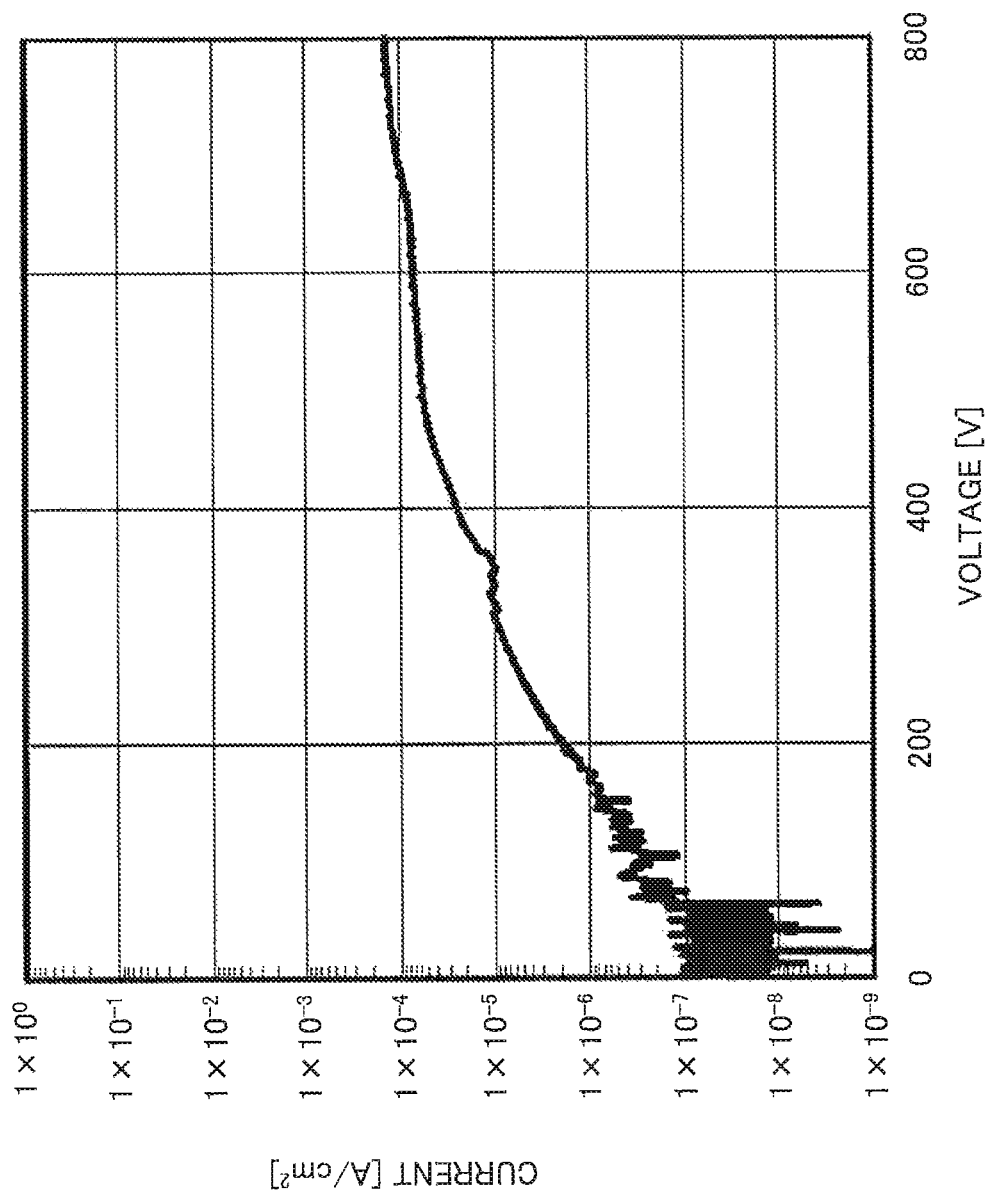
FIG. 11 is a graph indicating a relationship between a voltage applied across a source and a drain and a leak current flowing in a vertical direction in the semiconductor device according to the first embodiment.

FIG. 11 indicates a relationship between a voltage applied across a source and a drain and a leak current flowing in a vertical direction in the semiconductor device according to the present embodiment. Comparing the case of FIG. 11 and the case of FIG. 4, it is appreciated that a leak current flowing in the semiconductor device according to the present embodiment as lower than a leak current flowing in the case of FIG. 4. That is, a leak current can be reduced by doping C into the second superlattice buffer layer 22 at a concentration higher than or equal to $1 \times 10^{19}$ atoms/cm$^{-3}$.

In the present embodiment, each of the first superlattice buffer layer 21 and the second superlattice buffer layer 22 is formed by alternately laminating the AlN layer having the film thickness of 3.5 nm and the $Al_{0.1}Ga_{0.9}N$ layer having the film thickness of 20 nm. Thus, a warp of the silicon substrate is small and there is no crack generated in the formed nitride semiconductor layer. It should be noted that C is doped into the second superlattice buffer layer 22 at a concentration higher than or equal to $1 \times 10^{19}$ atoms/cm$^{-3}$, but C is not doped into the entire superlattice buffer layer 20. That is, C as an impurity element is not doped into the entire superlattice buffer layer 20 but doped into a portion of the superlattice buffer layer 20. Thus, a generation of a crack can be suppressed.

It should be noted that in the present embodiment, the first superlattice formation layer serving as the AlN layers 21a and 22a is formed by $Al_xGa_{1-x}N$ where a value of x is greater than or equal to 0.5 and smaller than or equal to 1. Additionally, the second superlattice formation layer serving as the $A_{0.1}Ga_{0.9}N$ layers 21b and 22b is formed by $Al_yGa_{1-y}N$ where a value of y is greater than 0 and smaller than 0.5. Accordingly, the semiconductor device is formed so that a relationship x>y is satisfied. More preferably, the first superlattice formation layer may be formed by AlN.

In the above-mentioned case, the first superlattice buffer layer 21 and the second superlattice buffer layer 22 have the same thickness. However, the thickness of the second superlattice buffer layer 22 may be larger than the thickness of the first superlattice buffer layer 21.

Additionally, in the above-mentioned case, the impurity element doped into the first and second superlattice buffer layers 21 and 22 is C. However, the impurity element doped may be a p-type impurity element. It should be noted that the impurity element doped is preferably A or Fe.

(Manufacturing Method of Semiconductor Device)

A description will now be given, with reference to FIGS. 12A through 12D, of a manufacturing method of the semiconductor device according to the present embodiment. According to the manufacturing method of the semiconductor device of the present embodiment, the nitride semiconductor layer is formed on the silicon substrate 10 by epitaxial growth. As a method of forming a nitride semiconductor by epitaxial growth, there is a metal organic chemical vapor deposition (MOCVD) and a molecular beam epitaxy (MBE).

In the explanation of the present embodiment, it is assumed that the nitride semiconductor layer is formed by MOCVD. When forming the nitride semiconductor layer, trimethyl aluminum (TMA) is used as an Al source gas, trimethyl gallium (TMG) is used as a Ga source gas, and ammonium ($NH_3$) is used as an N source gas.

Figure 12A:
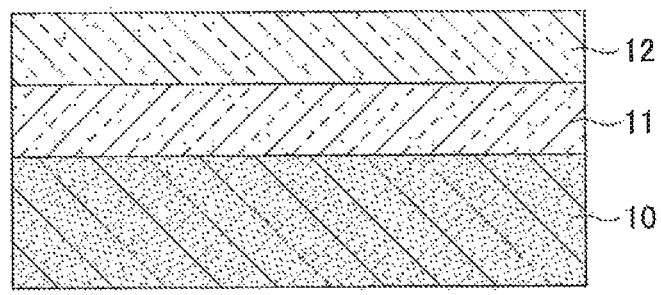
FIGS. 12A through 12D are cross-sectional views for explaining a manufacturing process of the semiconductor device according to the first embodiment.

First, as illustrated in FIG. 12A, a nuclear formation layer 11 and a buffer layer 12 are formed by a nitride semiconductor sequentially on the silicon substrate 10. Although a silicon (111) substrate is used as the silicon substrate 10 in the present embodiment, a substrate formed of SiC, sapphire, GaN, etc., may be used instead of the silicon substrate 10. The nuclear formation layer 11 is formed of an AlN film having a thickness of 200 nm. The buffer layer 12 is formed of $Al_{0.5}Ga_{0.5}N$.

The nuclear formation layer 11 is formed by causing AlN to epitaxially grown by supplying TMA and $NH_3$ in a condition in which a substrate temperature is about 1000° C. and a pressure in a chamber of an MOCVD apparatus is about 50 mbar (5 kPa). The buffer layer 12 is formed by causing Al0.5Ga0.5N to epitaxial grown by supplying TMA, TMA and $NH_3$ in a condition in which a substrate temperature is about 1000° C., and a pressure in a chamber of an MOCVD apparatus is about 50 mbar (5 kPa).

Figure 12B:
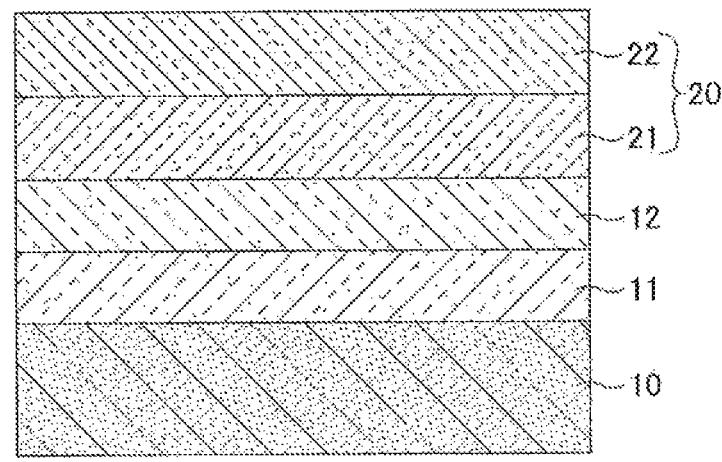

Then, as illustrated in FIG. 12B, the first superlattice buffer layer 21 and the second superlattice buffer layer 22 are sequentially laminated on the buffer layer 12. Specifically, as illustrated in FIG. 9, the first superlattice buffer layer 21 is formed by alternately and cyclically laminating the AlN layer 21a and the AlGaN layer 22b for 50 cycles. The first superlattice buffer layer 21 is formed by controlling supply of TMA, TMG and $NH_3$ in a condition in which a substrate temperature is about 1000° C. and a pressure in the chamber of the MOCVD apparatus is about 50 mbar (5 kPa).

Thereafter, the second superlattice buffer layer 22 is formed by alternately and cyclically laminating the AlN layer 22a and the AlGaN layer 22b or the first superlattice buffer layer 21 for 50 cycles. The second superlattice buffer layer 22 is formed by controlling supply of TMA, TMG and $NH_3$ in a condition in which a substrate temperature is about 950° C. and a pressure in the chamber of the MOCVD apparatus is about 50 mbar (5 kPa).

When forming the nitride semiconductor layer by MOCVD, a concentration of C mixed into the second superlattice buffer layer 22 can be increased by lowering a substrate temperature. That is, C can be automatically doped into the film by lowering the substrate temperature. Thus, a concentration of C doped into the second superlattice buffer layer 22 is preferably greater than or equal to $1\times10^{19}$ atoms/cm$^{-3}$ and smaller than or equal to $1\times10^{20}$ atoms/cm$^{-3}$. If should be noted that other than the method of automatically doping C by lowering the substrate temperature, there are a method of doping C by changing a ratio of supply amounts of source gases, a method of supplying a source gas for doping C as an impurity element, etc.

Figure 12C:
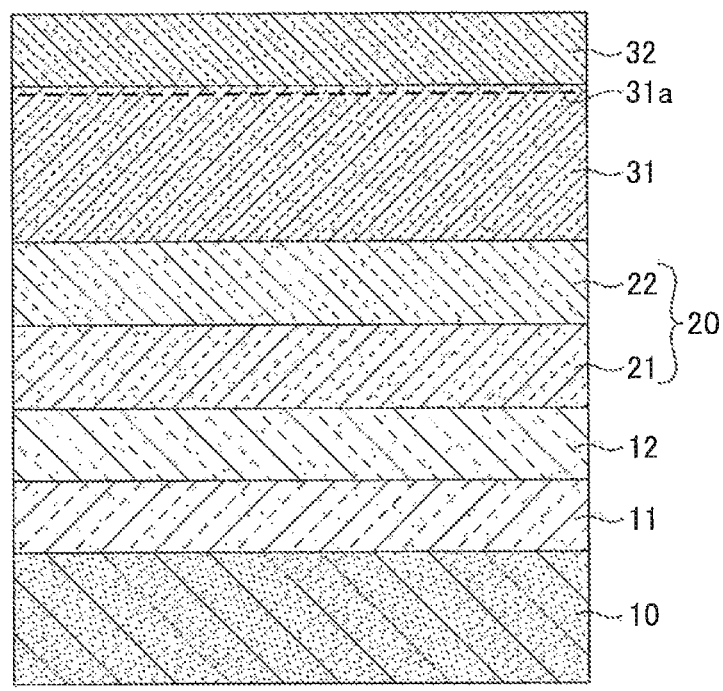

Then, as illustrated in FIG. 12C, the electron transit layer 31 and the electron supply layer 32 are laminated on the second superlattice buffer layer 22. Specifically, the electron transit layer 31 is formed by causing GaN having a film thickness of about 1000 nm to grow on the second superlattice buffer layer 222 under a condition in which a growth temperature is about 1000° C. and a pressure in the chamber of the MOCVD apparatus is about 200 mbar (20 kPa).

The electron supply layer 32 is formed by causing AlGaN having a film thickness of about 20 nm to grow on the electron transit layer 31 under a condition in which a growth temperature is about 1000° C. and a pressure in the chamber of the MOCVD apparatus is about 50 mbar (5 kPa). In the present embodiment, the electron supply layer 32 is formed by $Al_{0.2}Ga_{0.8}N$.

It should be noted that a cap layer (not illustrated in the figure) may be formed by N—GaN having a film thickness of 5 nm on the electron supply layer 32. The thus-formed cap layer is doped with Si as an impurity element at a concentration of greater than or equal to $1\times10^{18}$ atoms/cm$^{-3}$ and smaller than or equal to $1\times10^{20}$ atoms/cm$^{-3}$, for example, at a concentration of $5\times10^{18}$ atoms/cm$^{-3}$. When doping 31 into the cap layer, $SiH_4$ may be used.

Figure 12D:
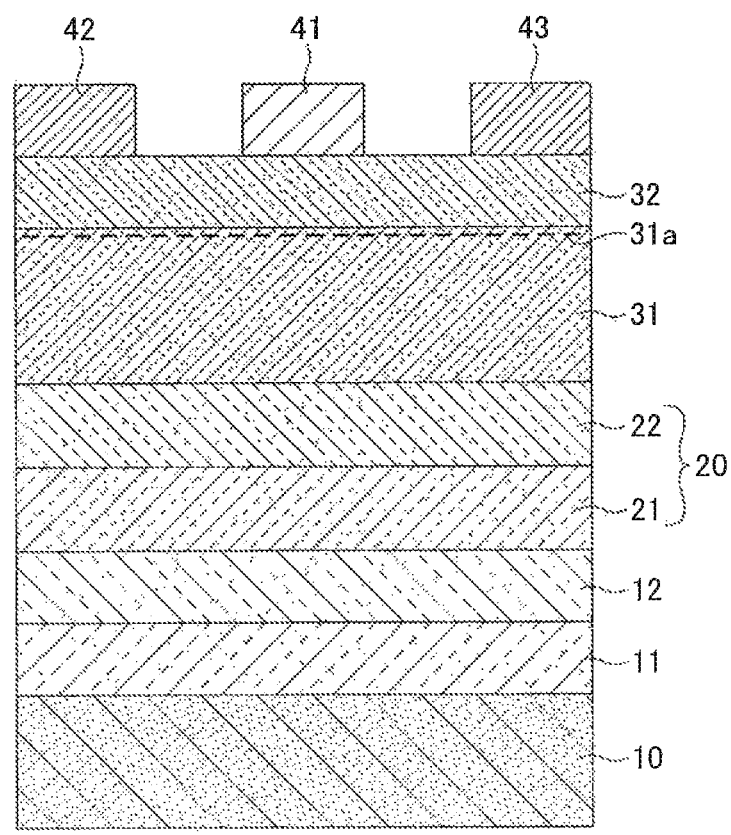

Then, as illustrated in FIG. 12D, the source electrode 42 and the drain electrode 43 are formed on the electron supply layer 32 and further the gate electrode 42 is formed on the electron supply layer 32. Specifically, a photoresist is applied onto the electron supply layer 32, and an exposure and development is performed by an exposure apparatus so as to form a resist pattern (not illustrated in the figure) having openings in areas where the source electrode 42 and the drain electrode 43 are to be formed. Thereafter, a metal lamination film made of a Ti/Al film is formed by a vacuum deposition. Then, the metal lamination film formed on the resist pattern is removed together with the resist pattern by immersing the resist pattern into an organic solvent, or the like. Thereby, the source electrode 42 and the drain electrode 43 are formed by remaining portions of the metal lamination film. Thereafter, a rapid thermal anneal (RTA) is performed to cause the source electrode 42 and the drain electrode 43 to make an ohmic contact with each other. It should be noted that in the metal lamination film made of Ti/Al film, the film thickness of the Ti film is about 100 nm and the film thickness of the Al film is about 300 nm.

Thereafter, a photoresist is applied on the electron supply layer 32 again, and an exposure and development is performed by an exposure apparatus so as to form a resist pattern (not illustrated in the figure) having an opening in an area where the gate electrode 41 is to be formed. Thereafter, a metal lamination film made of a Ni/Au film is formed by a vacuum deposition. Then, the metal lamination film formed on the resist pattern is removed together with the resist pattern by immersing the resist pattern into an organic solvent or the like. Thereby, the gate electrode 41 is formed by a remaining portion of the metal lamination film. It should be noted that in the metal lamination film made of Ni/Au film, the film thickness of the Ni film is about 50 nm and the film thickness of the Au film is about 300 nm.

In the present embodiment, a passivation film by be formed on the electron supply layer 32. Additionally, the semiconductor device according to the present embodiment may have a structure in which a gate recess id formed by removing a portion of the electron supply layer 32 in an area where the gate electrode 41 is to be formed. By forming the gate recess, a gate threshold voltage can be shifter in a positive direction, which can make the semiconductor device of a normally off type. The present embodiment may have a structure in which a gate insulation film is formed by $Al_2O_3$ or the like on the electron supply layer 32 and the gate electrode 41 is formed on the gate insulation film.

The semiconductor device according to the present embodiment can be manufactured by the above-mentioned processes.

Second Embodiment

Figure 13:
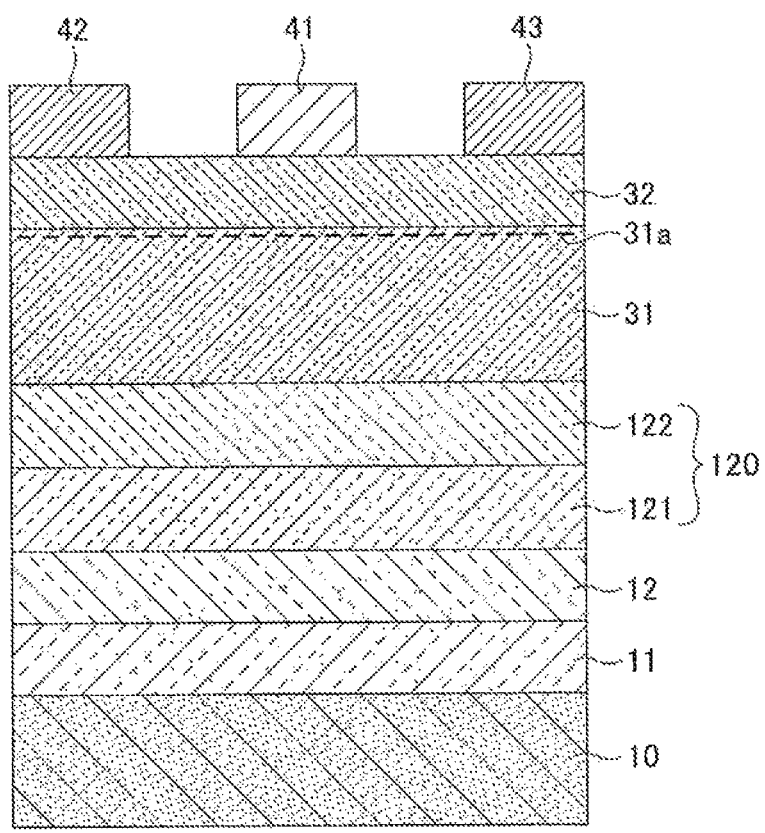
FIG. 13 is a cross-sectional view of a semiconductor device according to a second embodiment.

A description will be given, with reference to FIG. 13, of a semiconductor device according to a second embodiment. The semiconductor device according to the second embodiment has a structure in which nitride semiconductor layers are laminated on a silicon substrate 10 as illustrated in FIG. 13. Specifically, a nuclear formation layer 11, a buffer layer 12, a first superlattice buffer layer 121, a second superlattice buffer layer 122, an electron transit layer 31 and an electron supply layer 32 are laminated on the silicon substrate 10 in that order. In the present embodiment, a gate electrode 41, a source electrode 42 and a drain electrode 43 are formed on the electron supply layer 32. It should be noted that in the present embodiment, the first superlattice buffer layer 121 and the second superlattice buffer layer 122 together may be referred to a superlattice buffer layer 120.

In the present embodiment, the first superlattice buffer layer 121 is formed by alternately and cyclically laminating an AlN layer having a film thickness of 3.5 nm and an $Al_{0.1}Ga_{0.9}N$ layer having a film thickness of 20 nm for 50 cycles. The first superlattice buffer layer 121 is doped with Fe as an impurity element at a concentration of less than $1\times10^{19}$ atoms/cm$^{-3}$.

The second superlattice buffer layer 122 is formed by alternately and cyclically laminating an AlN layer having a film thickness of 3.3 nm and an $Al_{0.1}Ga_{0.9}N$ layer having a film thickness of 20 nm for 50 cycles. The second superlattice buffer layer 122 is doped with Fe as an impurity element at a concentration greater than or equal to $1\times10^{19}$ atoms/cm$^{-3}$ and smaller than or equal to $1\times10^{20}$ atoms/cm$^{-3}$.

In the present embodiment, the first superlattice buffer layer 121 is doped with Fe at a concentration of $2\times10^{18}$ atoms/cm$^{-3}$, and the second superlattice buffer layer is doped with Fe at a concentration of $2\times10^{19}$ atoms/cm$^{-3}$. As a source gas used when doping Fe, for example, ferrocene (Cp2Fe) is used.

Although the description was given of the case where Fe is doped into the first superlattice buffer layer 121 and the second superlattice buffer layer 122, Fe may be doped into only the second superlattice buffer layer 122. Additionally, if concentrations of the impurity element have the above mentioned relationship, C may be doped into one of the first and second superlattice layers 121 and 122, and Fe may be doped into the other of the first and second superlattice layers 121 and 122.

In the present embodiment, if the AlN layer in the first superlattice buffer layer 121 and the first superlattice formation layer, which is the AlN layer in the second superlattice buffer layer 122, are represented by $Al_xGa_{1-x}N$, a value of x is greater than or equal to 0.5 and smaller than or equal to 1. If the $Al_{0.1}Ga_{0.9}N$ layer in the first superlattice buffer layer 121 and the $Al_{0.1}Ga_{0.9}N$ layer in the second superlattice buffer layer 122 are represented by $Al_yGa_{1-y}N$, a value of y is greater than or equal to 0 and smaller than 0.5. Accordingly, a relationship x>y is satisfied. Additionally, the first, superlattice formation layer may be formed by AlN.

Configuration and arrangement of the present embodiment other than the above-mentioned configuration and arrangement are the same as the configuration and arrangement of the first embodiment.

Third Embodiment

Figure 14:
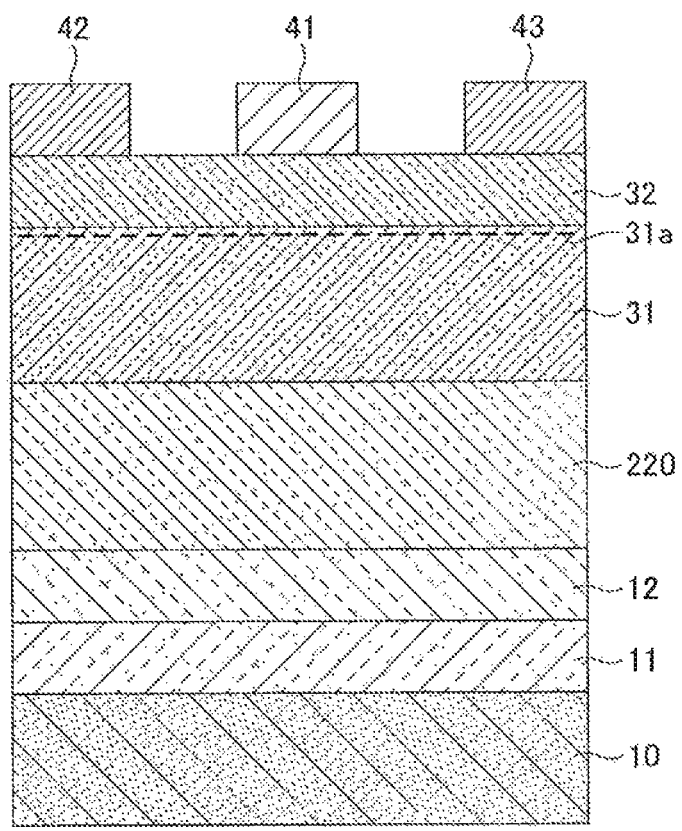
FIG. 14 is a cross-sectional view of a semiconductor device according to a third embodiment.

A description will be given, with reference to FIG. 14, of a semiconductor device according to a third embodiment. The semiconductor device according to the third embodiment has a structure in which nitride semiconductor layers are laminated on a silicon substrate 10 as illustrated in FIG. 14. Specifically, a nuclear formation layer 11, a buffer layer 12, a superlattice buffer layer 220, an electron transit layer 31 and an electron supply layer 32 are laminated on the silicon substrate 10 in that order. A gate electrode 41, a source electrode 42 and a drain electrode 43 are formed on the electron supply layer 32.

In the present embodiment the superlattice buffer layer 220 is formed by alternately laminating an AlN layer having a film thickness of 3.5 nm and an $Al_{0.1}Ga_{0.9}N$ layer having a film thickness of 20 nm for 100 cycles. The superlattice buffer layer 220 is doped with C as an impurity element. A concentration of G gradually increases from a side of the silicon substrate 10 toward a side of the electron transit layer 31. For example, in the superlattice buffer layer 220, a concentration of C is $2 \times 10^{18}$ atoms/cm$^{-3}$ near the interface between the superlattice buffer layer 220 and the buffer layer 12, and the concentration of C gradually increases toward the electron transit layer 31, and the concentration of C is $2 \times 10^{19}$ atoms/cm$^{-3}$ near the interface between the superlattice buffer layer 220 and the electron transit layer 31. Accordingly, in the present embodiment, a concentration distribution of C in the superlattice buffer layer 220 is slanted.

In the present embodiment, the first superlattice buffer layer and the second superlattice buffer layer may be sequentially laminated on the buffer layer 12 and a concentration gradient of an impurity element doped may be generated in the second superlattice buffer layer. In the second superlattice buffer layer, the concentration of C may be $2 \times 10^{18}$ atoms/cm$^{-3}$ near the interface between the second superlattice buffer layer and the first superlattice buffer layer, and the concentration of C gradually increases toward the electron transit layer 31, and the concentration of C may be $2 \times 19^{19}$ atoms/cm$^{-3}$ near the interface between the second, superlattice buffer layer 220 and the electron transit layer 31. In this case, the first superlattice buffer layer is doped with C at a concentration of $2 \times 10^{18}$ atoms/cm$^{-3}$.

The impurity element doped into the superlattice buffer layer 220 may be Fe other than C, and may be p-type impurity element.

In the present embodiment, if the first superlattice formation layer, which is the ALN layer in the superlattice buffer layer 220, is represented by $Al_xGa_{1-x}N$, a value of x is greater than or equal to 0.5 and smaller than or equal to 1. If the second superlattice formation layer, which is the $Al_{0.1}Ga_{0.9}N$ layer in the superlattice buffer layer 220 is represented by $Al_yGa_{1-y}N$, a value of y is greater than or equal to 0 and smaller than 0.5. Accordingly, a relationship x>y is satisfied. Additionally, the first superlattice formation layer may be formed by AlN.

Configuration and arrangement of the present embodiment other than the above-mentioned configuration and arrangement are the same as the configuration and arrangement of the first embodiment.

Fourth Embodiment

A description will be given below of a semiconductor device, power supply device and high-frequency amplifier according to a fourth embodiment.

Figure 15:
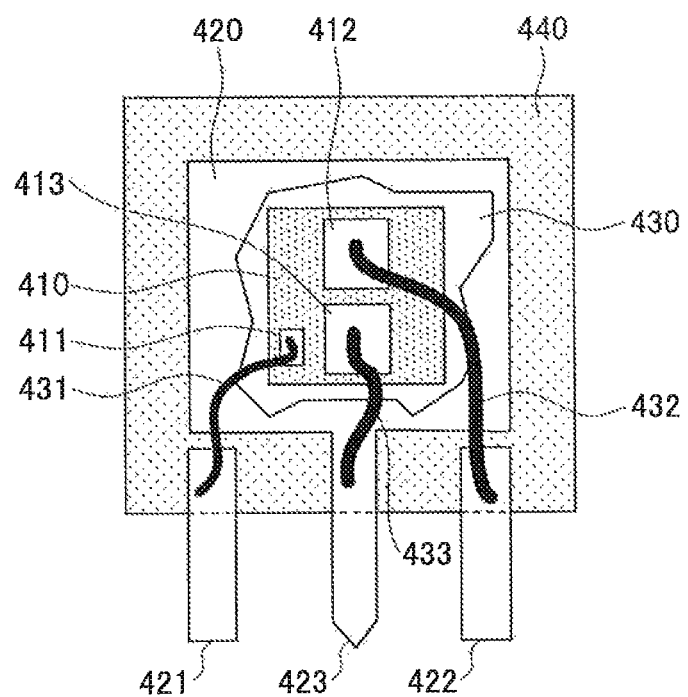
FIG. 15 is a plan view of an interior of a discrete-packaged semiconductor device according to a fourth embodiment.

The semiconductor device according to the seventh embodiment includes one of the semiconductor devices according to the first through third embodiments that is incorporated into a discrete package. The discrete-packaged semiconductor device is described with reference to FIG. 15. FIG. 15 schematically illustrates an interior of the discrete-packaged semiconductor device. The configuration and arrangement of the electrodes of the semiconductor device incorporated in the discrete package are different from those of the semiconductor devices according to the first through third embodiments.

First, an HEMT semiconductor chip 410 of GaN semiconductor material is formed by one or the semiconductor devices according to the first through three embodiments. Then, the semiconductor chip 410 is fixed on a lead frame 420 by a die-attachment agent 430 such as solder or the like. The semiconductor chip 410 corresponds to one of the semiconductor device according to the first through third embodiments.

Then, a gate electrode 411 is connected to a gate lead 421 by a bonding wire 431, a source electrode 412 is connected to a source lead 122 by a bonding wire 432 and a drain electrode 413 is connected to a drain lead 423 by a bonding wire 433. The bonding wires 431, 432 and 433 are made of a metal material such as Al or the like. In the present embodiment, the gate electrode 411 is a gate electrode pad, which is connected to the gate electrode 41 of one of the semiconductor devices according to the first through third embodiments. The source electrode 412 is a source electrode pad, which is connected to the source electrode 42 of one of the semiconductor devices according to the first through third embodiments. The drain electrode 413 is a drain electrode pad, which is connected to the drain electrode 43 of one of the semiconductor devices according to the first through third embodiments.

Then, the semiconductor chip 410 and the lead frame 420 are encapsulated by a mold resin 440 using a transfer mold method. As mentioned above, the discrete-packaged semiconductor device, which is an HEMT using GaN semiconductor material, is fabricated.

A description is given of a power supply device and a high-frequency amplifier according to the fourth embodiment. The power supply device and the high-frequency amplifier according to the fourth embodiment incorporates therein one of the semiconductor devices according to the first through third embodiments.

Figure 16:
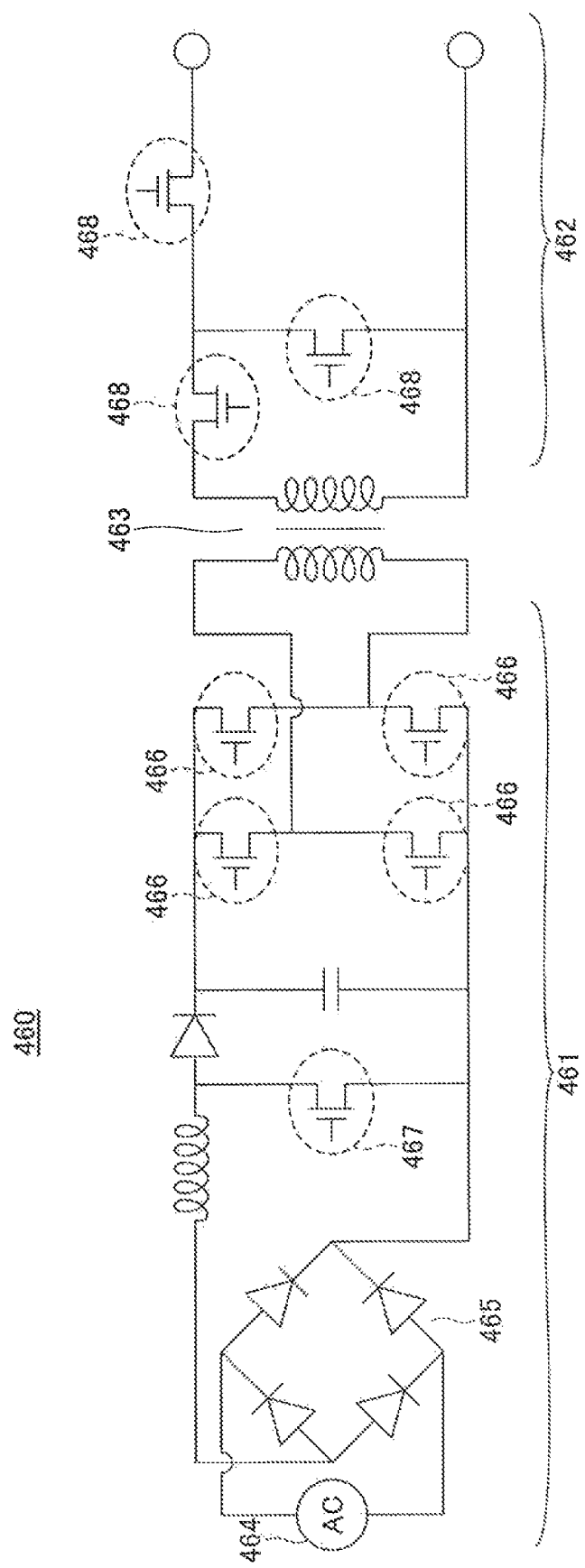
FIG. 16 is a circuit diagram of a power supply device according to the fourth embodiment.

First, a description is given with reference to FIG. 16, of a power supply device according to the fourth embodiment. The power supply device 460 according to the fourth embodiment includes a primary circuit 461 of a high-voltage, a secondary circuit 461 of a low-voltage, and a transformer 463 provided between the primary circuit 461 and the secondary circuit 462. The primary circuit 461 includes an alternating-voltage power source 464, a so-called bridge rectifying circuit 465, a plurality of switching devices 466 (four switching devices are illustrated in FIG. 16) and another switching device 457. The secondary circuit 462 includes a plurality of switching devices 468 (three switching devices are illustrated in FIG. 16). In the power supply device 460 illustrated in FIG. 16 semiconductor devices according to the first through third embodiments are used as the switching devices 466 and 467 of the primary circuit 461. The switching devices 466 and 467 of the primary circuit 161 are preferably normally-off semiconductor devices. A metal insulator semiconductor filed effect transistor (MISET) is used as the switching device 468 of the secondary circuit 462.

Figure 17:
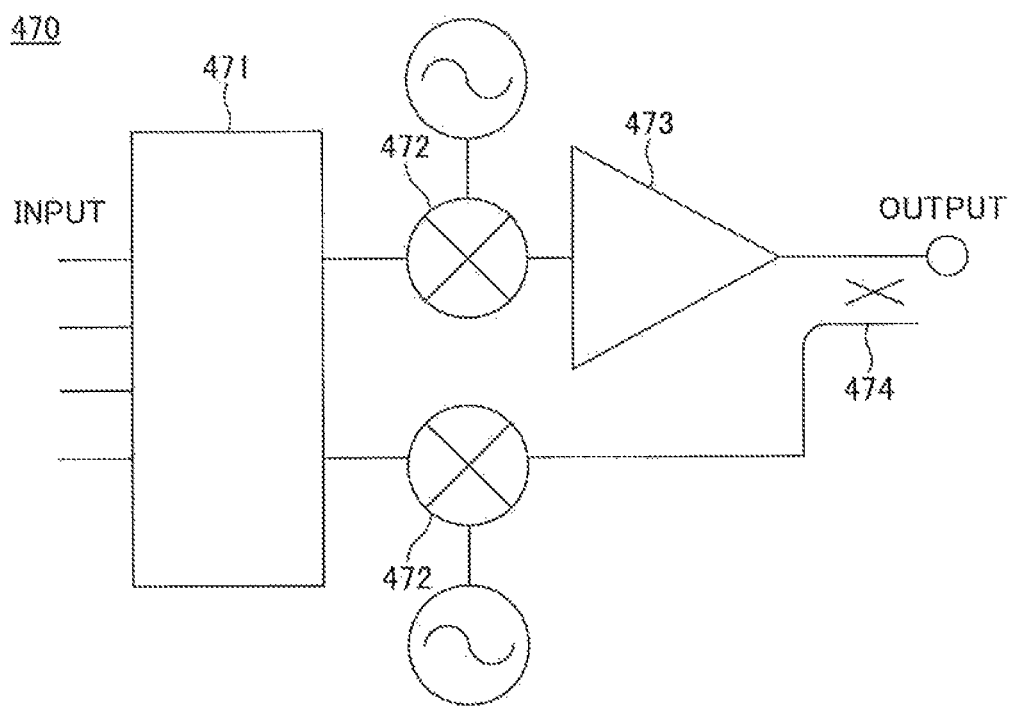
FIG. 17 is a circuit diagram of a high-power amplifier according to the fourth embodiment.

A description is given below, with reference to FIG. 17, of a high-frequency amplifier according to the fourth embodiment. The high-frequency amplifier 470 according to the present embodiment may be applied to, for example, a power amplifier of a base station of a cellular phone system. The high-frequency amplifier 470 includes a digital predistortion circuit 471, a mixer 472, a power amplifier 473 and a directional coupler 474. The digital predistortion circuit 471 compensates for a linear distortion of an input signal. The mixer 472 mixes the input signal of which a linear distortion is compensated and an alternating current signal. The power amplifier 473 amplifies the input signal mixed with the alternating current signal. In the circuit illustrated in FIG. 17, the power amplifier 473 includes one of the semiconductor devices according to the first through third embodiments. The directional coupler 474 monitors the input signal and an output signal. In the circuit illustrated in FIG. 17, for example, an output signal can be mixed with the alternating current signal by the mixer 472 and can be sent to the digital predistortion circuit 471.

All examples and conditional language recited herein are intended for pedagogical purposes to and the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A semiconductor device comprising:
    a first superlattice buffer layer formed on a substrate;
    a second superlattice buffer layer formed on said first superlattice buffer layer;
    a first semiconductor layer formed by a nitride semiconductor on said second superlattice buffer layer;
    a second semiconductor layer formed by a nitride semiconductor on said first semiconductor layer; and
    a gate electrode, a source electrode and a drain electrode formed on said second semiconductor layer,
    wherein said first superlattice buffer layer is formed by alternately and cyclically laminating a first superlattice formation layer and a second superlattice formation layer, and
    said second superlattice buffer layer is formed by alternately and cyclically laminating the first superlattice formation layer and the second superlattice formation layer, and
    the first superlattice formation layer is formed by $Al_xGa_{1-x}N$, and the second superlattice formation layer is formed by $A_yGa_{1-y}N$, where x>y, and
    a concentration of an impurity element serving as an acceptor doped into said second superlattice buffer layer is higher than a concentration of an impurity element serving as an acceptor doped into said first superlattice buffer layer.

2. The semiconductor device as claimed in claim 1, wherein a concentration of the impurity element of serving as an acceptor doped into said second superlattice buffer layer is greater than or equal to $1\times10^{19}$ atoms/cm$^{-3}$, and a concentration of the impurity element serving as an acceptor doped into said first superlattice buffer layer is smaller than $1\times10^{19}$ atoms/cm$^{-3}$.

3. The semiconductor device as claimed in claim 1, wherein a thickness f said second superlattices buffer layer is greater than or equal to a thickness of said first superlattice buffer layer.

4. The semiconductor device as claimed in claim 1, further including a buffer layer formed by a material containing AlGaN between said substrate and said first superlattice buffer layer.

5. The semiconductor device as claimed in claim 1, wherein said impurity element serving as an acceptor is C or Fe.

6. The semiconductor device as claimed in claim 1, wherein said substrate is formed by one of Si, Sic, sapphire and GaN.

7. The semiconductor device as claimed in claim 1, wherein said first superlattice formation layer is formed by AlN.

8. The semiconductor device as claimed in claim 1, wherein said first semiconductor layer is formed by a material containing GaN.

9. The semiconductor device as claimed in claim 1, wherein said second semiconductor layer is formed by a material containing AlGaN or InAlGaN.

10. A semiconductor device comprising:
    a superlattice buffer layer formed on a substrate;
    a first semiconductor layer formed by a nitride semiconductor on said superlattice buffer layer;
    a second semiconductor layer formed by a nitride semiconductor on said first semiconductor layer; and
    a gate electrode, a source electrode and a drain electrode formed on said second semiconductor layer,
    wherein said superlattice buffer layer is formed by alternately and cyclically laminating a first superlattice formation layer and a second superlattice formation layer, and
    said first superlattice formation layer is formed by $Al_xGa_{1-x}N$, and said superlattice formation layer is formed by $A_yGa_{1-y}N$, where x>y, and
    a concentration of an impurity element serving as an acceptor in said superlattice buffer layer increases from a side of said substrate toward a side of said first semiconductor layer.

11. The semiconductor device as claimed in claim 10, wherein said impurity element serving as an acceptor is C or Fe.

12. The semiconductor device as claimed in claim 10, further comprising a buffer layer formed by a material containing AlGaN between said substrate and said superlattice buffer layer.

13. The semiconductor device as claimed in claim 10, wherein said substrate is formed by one of Si, SiC, sapphire and GaN.

14. The semiconductor device as claimed in claim 10, wherein said first superlattice formation layer is formed by AlN.

15. The semiconductor device as claimed in claim 10, wherein said first semiconductor layer is formed by a material containing GaN.

16. The semiconductor device as claimed in claim 10, wherein said second semiconductor layer is formed by a material containing AlGaN or InAlGaN.

17. A manufacturing method of a semiconductor device, comprising:
- forming a first superlattice buffer layer by alternatively and cyclically laminating a first superlattice formation layer and a second superlattice formation layer on a substrate;
- forming a second superlattice buffer layer by alternately and cyclically laminating the first superlattice formation layer and the second superlattice formation layer on said first superlattice buffer layer;
- forming a first semiconductor layer by a nitride semiconductor on said second superlattice buffer layer;
- forming a second semiconductor layer by a nitride semiconductor on said first semiconductor layer; and
- forming a gate electrode, a source electrode and a drain electrode on said second semiconductor layer,
- wherein the first superlattice formation layer is formed by $Al_xGa_{1-x}N$ and the second superlattice formation if formed by $Al_yGa_{1-y}M$, where x>y, and
- said first superlattice buffer layer and said second superlattice buffer layer are formed by a metal organic chemical vapor deposition, and
- a substrate temperature when forming said second superlattice buffer layer is lower than a substrate temperature when forming said first superlattice buffer layer.

* * * * *